(12) United States Patent
Takano et al.

(10) Patent No.: US 7,082,290 B2
(45) Date of Patent: Jul. 25, 2006

(54) COMMUNICATION SEMICONDUCTOR INTEGRATED CIRCUIT, A WIRELESS COMMUNICATION APPARATUS, AND A LOOP GAIN CALIBRATION METHOD

(75) Inventors: Ryoichi Takano, Takasaki (JP); Kenji Toyota, Takasaki (JP); Patrick Wurm, Comberton (GB); Robert Astle Henshaw, Sudbury (GB); David Freeborough, Balsham (GB)

(73) Assignees: Renesas Technology Corp., Tokyo (JP); TTPCOM Limited, Hertfordshire (GB)

( * ) Notice: Subject to any disclaimer, the term of this patent is extended or adjusted under 35 U.S.C. 154(b) by 293 days.

(21) Appl. No.: 10/372,981

(22) Filed: Feb. 26, 2003

(65) Prior Publication Data

US 2004/0198257 A1    Oct. 7, 2004

(30) Foreign Application Priority Data

May 31, 2002    (GB)    .................... 0212725.6

(51) Int. Cl.
*H04B 1/02*    (2006.01)
(52) U.S. Cl. ............... 455/102; 455/108; 455/110; 375/300; 375/302
(58) Field of Classification Search ............... 455/108, 455/126, 127.1, 127.2, 115.1, 115.2, 102, 455/110, 67.11, 67.14, 69, 127.3, 63.13, 84, 455/206, 264, 343.1, 341, 550.1, 575.1, 424, 455/425, 456.5, 456.1, 561, 403, 91, 522, 455/517, 63.1, 180.3, 208, 232.1, 319, 318, 455/323, 306, 307, 205, 118, 119; 370/205, 370/263, 345, 342, 347, 344; 330/141, 204, 330/281, 296, 199, 202, 297, 307, 100, 285, 330/129, 149, 133, 282; 375/297, 312, 296, 375/298, 295, 300, 302; 332/144, 149, 117

See application file for complete search history.

(56) References Cited

U.S. PATENT DOCUMENTS 4,571,549 A    2/1986    Lods et al.

(Continued)

FOREIGN PATENT DOCUMENTS

DE    100 56 472    11/2000

(Continued)

OTHER PUBLICATIONS

"High Linearity RF Amplifier Design", Artech House, 1979, P. Kenington, p. 162.

*Primary Examiner*—Edward F. Urban
*Assistant Examiner*—Charles Chow
(74) *Attorney, Agent, or Firm*—Mattingly, Stanger, Malur & Brundidge, P.C.

(57) ABSTRACT

A polar-loop wireless communication apparatus includes, on a forward path between an amplitude detector and a power amplifier which constitute an amplitude control loop, a variable gain amplifier and a switch to change characteristics of a loop filter to output a frequency bandwidth of the amplitude control loop to an order less than an order for normal operation. The system is operated with the characteristics set to the lower order to measure outputs from the power amplifier to calibrate the output power of the power transmitter, and the register is operated with the characteristics set to the higher order to measure the open loop gain of the amplitude control. According to results of the calculation, data to correct gain characteristics of the variable gain amplifier with respect to an output control signal is stored in a nonvolatile memory of a baseband circuit.

8 Claims, 16 Drawing Sheets

U.S. PATENT DOCUMENTS

| | | | |
|---|---|---|---|
| 5,091,706 A | 2/1992 | Lautzenhiser | |
| 5,101,506 A | 3/1992 | Walls | |
| 5,408,197 A * | 4/1995 | Miyake | 330/129 |
| 5,430,416 A | 7/1995 | Black et al. | |
| 5,710,991 A * | 1/1998 | Lee | 455/126 |
| 5,802,450 A | 9/1998 | Horton | |
| 5,852,770 A * | 12/1998 | Kasamatsu | 455/126 |
| 5,910,753 A | 6/1999 | Bogdan | |
| 6,018,275 A | 1/2000 | Perrett et al. | |
| 6,147,553 A | 11/2000 | Kolanek | |
| 6,215,362 B1 | 4/2001 | Feng et al. | |
| 6,721,368 B1 * | 4/2004 | Younis et al. | 375/295 |
| 6,850,574 B1 * | 2/2005 | Schwent et al. | 375/297 |
| 6,853,836 B1 * | 2/2005 | Asam et al. | 455/126 |
| 2002/0080716 A1 | 6/2002 | Asam et al. | |
| 2003/0203720 A1 * | 10/2003 | Oosawa et al. | 455/84 |
| 2004/0248528 A1 * | 12/2004 | Rozenblit et al. | 455/126 |

FOREIGN PATENT DOCUMENTS

| | | |
|---|---|---|
| EP | 0 339 605 | 11/1989 |
| EP | 0 457 749 | 11/1991 |
| EP | 0 535 669 | 1/1992 |
| EP | 0 731 556 | 9/1996 |
| EP | 0 786 864 | 7/1997 |
| EP | 0 788 236 | 8/1997 |
| EP | 0 797 298 | 9/1997 |
| EP | 1 115 205 | 7/2001 |
| EP | 1211801 | 6/2002 |
| GB | 2 237 157 | 4/1991 |
| GB | 2291754 | 1/1996 |
| GB | 2 369 941 | 6/2002 |
| JP | 3-209994 | 9/1991 |
| JP | 4-372246 | 12/1992 |
| JP | 11-355139 | 12/1999 |
| JP | 2000-244341 | 9/2000 |
| SU | 756603 | 8/1980 |
| WO | 95/23453 | 8/1995 |
| WO | 01/41296 | 6/2001 |
| WO | 02/035787 | 5/2002 |
| WO | 02/37666 | 5/2002 |

* cited by examiner

COMMUNICATION SEMICONDUCTOR INTEGRATED CIRCUIT, A WIRELESS COMMUNICATION APPARATUS, AND A LOOP GAIN CALIBRATION METHOD

CROSS-REFERENCE TO RELATED APPLICATION

The present application relates to subject matters described in the U.S. patent applications being file based on the United Kingdom Patent Applications No. 0212737.1 filed on May 31, 2002, No. 0212729.8 filed on May 31, 2002, No. 0212723.1 filed on May 31, 2002, No. 0212735.5 filed on May 31, 2002, and No. 0212732.2 filed on May 31, 2002. All of those U.S. applications are assigned to the same assignees of the present application.

BACKGROUND OF THE INVENTION

The present invention relates to a technique for improving controllability of output power using a power control signal in a high-frequency power amplifier circuit and for calibrating variation or dispersion in a characteristic thereof due to deviation of a gain of an amplifier control loop, and in particular, to a technique effectively applicable to a communication semiconductor integrated circuit including a phase detecting or detector circuit and an amplifier detecting circuit and to a wireless or radio communication apparatus such as a portable telephone including the wireless communication apparatus.

One of the systems for wireless communication apparatuses (mobile communication apparatuses) such as a portable telephone of the prior art is a global system for mobile communication (GSM) adopted in Europe. This system uses a phase modulation method called a Gaussian Minimum Shift Keying (GMSK) method in which a phase of a carrier wave or a carrier signal is shifted according to transmission data.

In general, a transmission output section of a wireless communication apparatus includes a high-frequency power amplifier circuit, and some GSM wireless communication apparatuses of the prior art are configured as below. To obtain output power required for a telephone call, a bias voltage of the high-frequency power amplifier is controlled by a control voltage outputted from a circuit called "automatic power control (APC) circuit" which generates a control signal of transmitting or transmission power according to a signal from a detector to detect transmitting or transmission power and a transmission request level from a baseband LSI.

Incidentally, for recent portable telephones, a system of enhanced data rates for GSM evolution (EDGE) has been proposed, the EDGE system having a dual-mode communicating function in which an audio signal is communicated in the GMSK modulation and data is communicated in 3π/8 rotating 8-PSK (phase shift keying) modulation. The 8-PSK modulation is a modulation implemented by adding, for example, amplitude shift to the carrier phase shift of the GMSK modulation. In comparison with the GMSK modulation in which information of one bit is transmitted per symbol, information of three bits is transmitted per symbol in the 8-PSK modulation. Therefore, a higher transmission rate can be used for communication in the EDGE than in the GSM.

As a method to implement a modulation method in which each of a phase component and an amplitude component of a transmitting or transmission signal contain information, there has been heretofore known a method called "polar loop" in which a signal to be transmitted is divided into a phase component and an amplitude component, a feedback operation is conducted for the components respectively by a phase component loop and an amplitude component loop, and signals resultant from the feedback operations are mixed with each other by an amplifier to output a signal (described, for example, in page 162 of "High Linearity RF Amplifier Design" written by Peter B. Kenington and published from ARTECH HOUSE, INC. in 1979).

Since it is necessary in the GSM communication system to output a phase-modulated signal according to a requested output level, a high-frequency power amplifier circuit in a final stage can be operated in a saturation range. In contrast therewith, in a wireless communication system capable of conducting communication in the EDGE method, the high-frequency power amplifier circuit in the final stage must be operated in a non-saturation range. However, in a drive method to drive a high-frequency power amplifier circuit used in the GSM communication system of the prior art, it is difficult to keep linearity required for the high-frequency power amplifier circuit in a region of a low output level. In comparison with this method, the polar loop method is advantageous: the request of linearity for the high-frequency power amplifier circuit can be satisfied and power efficiency in a low output level range can also be improved.

SUMMARY OF THE INVENTION

In this situation, the inventors of the present invention discussed adoption of the polar loop method in the EDGE wireless communication system. As a result, there has been detected a problem that when the 8-PSK modulation is carried out in the polar loop method, it is difficult to satisfy requirements of specifications of, for example, precision of modulation for a transmission waveform (error vector magnitude (EVM)) and a degree of noise suppression.

Specifically, there is a problem in which while the modulating precision is higher and a characteristic called "spectral re-growth" indicating a degree of waveform distortion becomes better when the frequency bandwidth of the amplitude control loop (a frequency range from a central frequency of the transmission carrier wave to a frequency thereof for which an open loop gain is 0 decibel (dB)) is wider, attenuation of the amplitude control loop becomes smaller for a receiving or reception frequency apart from 20 megaherz (MHz) from the central frequency of the transmission carrier wave and a sufficient degree of noise suppression cannot be obtained when the bandwidth is wide.

In addition, in two feedback loops, the loop gain particularly of the amplifier control loop varies due to dispersion or variation in characteristics of constituent components in production and hence stability of the loop decreases, and hence it is difficult to obtain a desired output level in a specified or predetermined period of time. It has been also detected that the system of the polar loop has a problem that when an output control operation is conducted for the amplitude modulation in the amplitude control loop, the gain of the amplitude control loop changes to reduce a phase margin and hence stability of the loop is lowered.

It is therefore an object of the present invention to improve the modulating precision of a transmission waveform and the spectral re-growth and to sufficiently suppress noise in a receiving frequency bandwidth in a wireless communication apparatus such as a portable telephone having a function to conduct phase modulation and amplitude modulation.

Another object of the present invention is to provide a reliable wireless communication apparatus which prevents degradation in stability of a loop due to variation in a loop gain caused by dispersion in characteristics of constituent components in production.

Still another object of the present invention is to provide a reliable wireless communication apparatus which prevents, when an output control operation is conducted for amplitude modulation, degradation in stability of a loop due to decrease in a phase margin caused by variation in an amplitude control loop gain.

An outline of representative aspects of the present invention is as follows.

In a wireless communication apparatus of polar loop type having a phase control loop to control a phase of a carrier wave or signal outputted from a transmission oscillator and an amplitude control loop to control amplitude of a transmission output signal outputted from a power amplifier circuit, there are disposed, on a forward path from an amplifier detector circuit to a power amplifier circuit which constitute the amplifier control loop, a variable gain amplifier circuit and a switching unit capable of conducting a change-over of a characteristic of a loop filter for a frequency bandwidth of the amplitude control loop to a degree lower than a degree of the filter in an ordinary operation. While the system is being operated in a state in which the loop filter characteristic is changed to the lower-degree filter characteristic, the output from the power amplifier is measured in this state to calculate variation in the gain of the amplifier loop. According to a result of the calculation, there is obtained data to calibrate or to correct the gain characteristic of the variable gain amplifier circuit with respect to an output control signal in order to reduce the variation. The correction or corrective data thus obtained is stored in a nonvolatile memory in a baseband large scale integration (LSI) chip. Resultantly, by changing the loop filter characteristic to the lower-degree filter characteristic, the measurement can be conducted when the amplitude control loop is in a more stable state. Additionally, by correcting the gain characteristic of the variable gain amplifier circuit with respect to an output control signal according to the correction data beforehand measured and stored in the nonvolatile memory, it is possible to calibrate or to correct the variation in the gain of the amplitude control loop caused by the dispersion in characteristics of constituent components in production.

According to the present invention, there is provided a wireless communication apparatus of polar loop type having a phase control loop to control a phase of a carrier wave outputted from a transmission oscillator and an amplitude control loop to control amplitude of a transmission output signal outputted from a power amplifier circuit. A variable gain amplifier circuit is disposed in a feedback path from a transmission output level detector circuit to an amplitude detector circuit which constitute the amplitude control loop. A variable gain amplifier circuit is disposed also in a forward path from the amplitude detector circuit to the power amplifier circuit of the loop. Gains of the variable gain amplifier circuits are controlled in mutually opposing directions and the sum of gain of the power amplifier circuit and gain respectively of the variable gain amplifier circuits is controlled to be fixed regardless of the output control signal. As a result, even when the output power is changed, the open loop gain of the amplitude control loop can be kept fixed. This prevents the degradation of stability of the loop due to the variation or deviation in the loop gain.

Other objects, features and advantages of the invention will become apparent from the following description of the embodiments of the invention taken in conjunction with the accompanying drawings.

DESCRIPTION OF THE INVENTION

Figure 1:
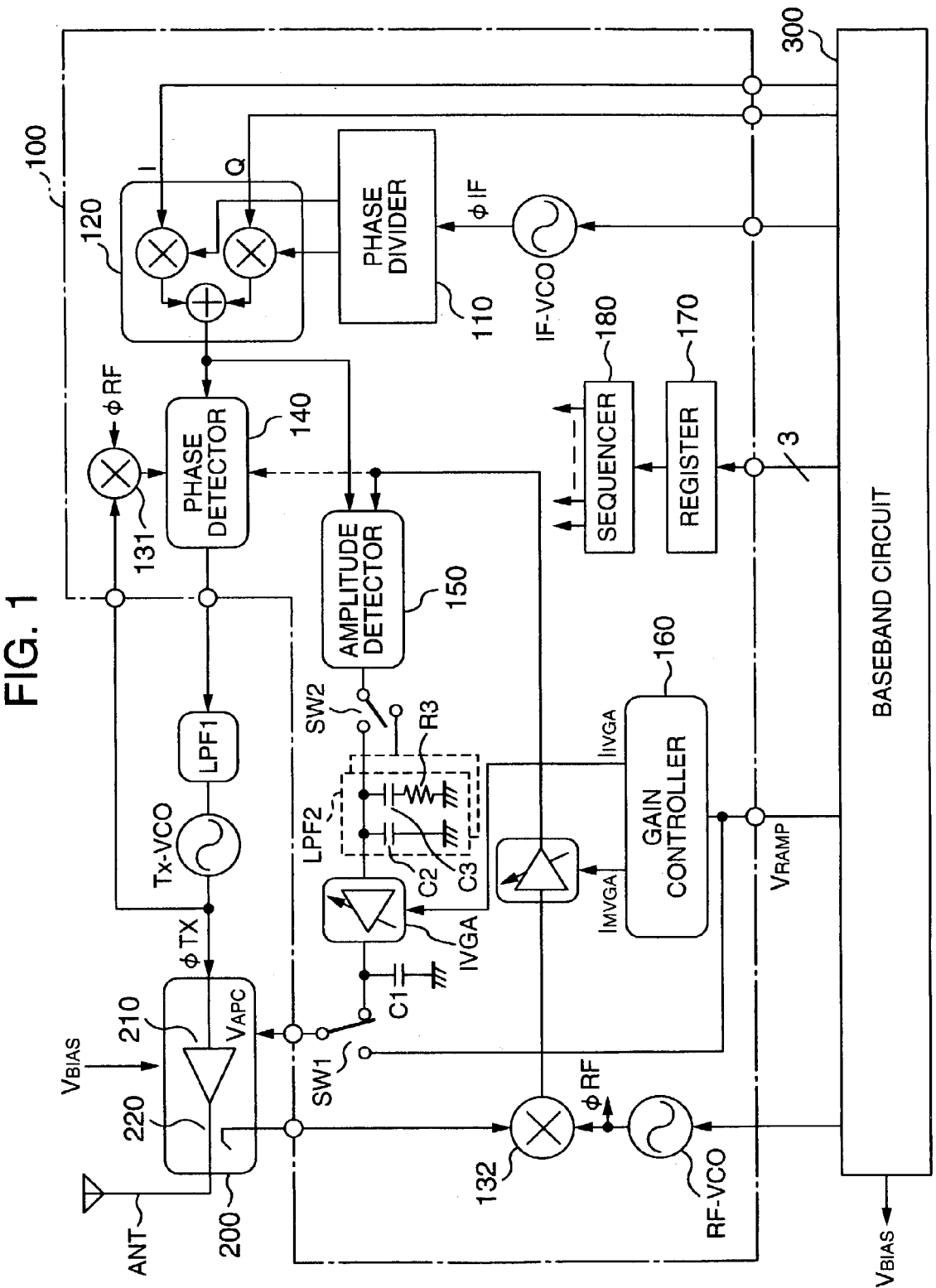
FIG. 1 is a block diagram showing an outline of a configuration of a transmitting circuit of polar loop type in an embodiment of the present invention and an example of a configuration of a wireless communication system using the transmitting circuit.

FIG. 1 shows an outline of a configuration of an embodiment of a transmitting circuit of polar loop type according to the present invention. The configuration of FIG. 1 includes a high-frequency integrated circuit (IC) 100 to conduct GMSK modulation in a GSM system or 8-PSK modulation in an EDGE system, a power module 200 including a high-frequency power amplifier circuit (to be abbreviated as a power amplifier hereinbelow) 210 to conduct communication via an antenna ANT and a coupler 220 to detect transmission power, a baseband circuit 300 which generates an I/Q signal according to transmission data (a baseband signal), a control signal of the radio-frequency IC 100, and a bias voltage VBIAS for the power amplifier 210 in the power module 200, a transmission oscillator TxVCO to generate a phase-modulated transmission signal (carrier wave), and a loop filter LPF1 to limit a bandwidth of a phase control loop.

The radio-frequency IC 100 is a semiconductor integrated circuit formed on one semiconductor chip. Although not shown in FIG. 1, there is formed on the chip of the radio-frequency IC 100, in addition to the circuits for transmission described above, a receiving circuit 190 (reference is to be made to FIG. 3) including a low-noise amplifier (LNA), a mixer (Rx-MIX) to directly convert a reception signal into a baseband signal, and a high-gain programmable gain amplifier (PGA). The radio-frequency IC 100, the transmission oscillator TxVCO, the loop filter LPF, and the like can be mounted on an insulating substrate such as a ceramic substrate into one module. The polar loop of the embodiment includes two control loops, namely, a feedback loop for phase control (to be referred to as a phase loop hereinbelow) and a feedback loop for amplitude control (to be referred to as a amplitude loop hereinbelow).

The radio-frequency IC 100 configuring the polar loop of the embodiment includes a phase divider or demultiplexer circuit 110 which receives an intermediate-frequency oscillation signal φRF generated from an oscillator IF-VCO to generate signals apart 90° in phase from each other, a quadrature modulator circuit 120 which conducts quadrature modulation by mixing an I/Q signal from the baseband circuit 300 with a divided signal from the phase divider circuit 110, a mixer 131 which mixes a feedback signal from the transmission oscillator TxVCO with an oscillation signal φRF signal from an RF-VCO to generate a signal having a frequency of 80 MHz, a phase detector circuit 140 to detect a phase difference between an output signal from the mixer 131 and an output signal from the quadrature modulator circuit 120, a mixer 132 to mix a detection signal from the coupler 220 to detect an output level from the power amplifier with an oscillation signal φRF from the high-frequency oscillator RF-VCO, a variable gain amplifier MVGA on feedback side to amplify an output from the mixer 132, an amplitude detector 150 to compare the amplified signal with an output signal from the quadrature modulator 120 to detect an amplitude difference, a loop filter LPF2 which generates a voltage corresponding to the output from the amplitude detector 150 and which limits a frequency bandwidth of the amplitude loop, a variable gain amplifier IVGA on forward side to amplify the output from the loop filter LPF2, a gain control circuit or controller 160 to control gain of the variable gain amplifiers MVGA and IVGA, a register 170 to store, for example, control information in the chip such as an offset value and a slope value, which will be described later, and an operation mode; and sequencer 180 which outputs timing signals for circuits in the chip according to values set to the register 170 to operate the circuits in a specified order according to the operation mode. After IVGA, there are a VIC (voltage to current converter), a capacitor C1 and a level shifter LVS, followed by the switch SW1.

The coupler 220, the mixer 132, the amplifier MVGA, the amplitude detector 150, the loop filter LPF2, the amplifier IVGA, and the power amplifier 210 configure an amplitude loop. In the embodiment, the phase detector 140, the loop filter LPF1, the oscillator TxVCO, the mixer 131, and the phase detector 140 configure a phase loop. Concretely, when a phase difference appears between the output signal from the quadrature modulator 120 and the feedback signal from the mixer 131, a voltage to reduce the difference is fed to a frequency control terminal of the transmitting oscillator TxVCO so that the phase of the feedback signal from the mixer 131 matches that of the output signal from the quadrature modulator 120. The phase loop controls such that the phase of the feedback signal from the mixer 131 is kept unchanged regardless of variation in the power source voltage and variation in temperature. The amplitude of the signal from the oscillator TxVCO is fixed.

In the embodiment, the output from the variable gain amplifier MVGA is fed back to the phase detector 140 so that a path including the coupler 220, the mixer 132, and the amplifier MVGA is used for both of the amplitude and phase loops. In the EDGE mode, the output from the power amplifier 210 contains a phase-modulated component and an amplitude-modulated component. In GMSK mode, the feedback is taken from the TxVCO output. Therefore, either the output from the oscillator TxVCO or the output from the power amplifier 210 is available as the feedback signal to the phase detector 140, the signal including a phase component. The loop with the feedback taken from the TxVO is called Sub loop. The loop with the feedback taken from the power amplifier is called Main loop. However, at startup of transmission, the output from the power amplifier 210 is not at a specified level or is not ready for the operation, the phase loop cannot be locked in EDGE mode. On the other hand, since the feedback path of the amplitude loop is required or essential in EDGE mode, the feedback path may provide feedback signals to both the phase and amplitude detectors. This requires the amplitude loop to be locked before the phase loop can be changed from Sub to Main. Then the feedback path associated with the phase loop can be turned off. This leads to an advantage that power consumption is reduced and the phase modulation can be conducted with high precision.

In GMSK mode, the amplitude loop does not require a very accurate control of the amplitude signal. Therefore, a single pole is enough to control the amplitude. This single loop filter guarantees stability of the loop and the open loop gain of the amplitude is designed to get a good compromise between noise suppression and amplitude loop bandwidth. The low open gain in GMSK mode is indicated by a broken line B in FIG. 2. The corresponding gain loop bandwidth is 200 kHz in GMSK mode. However, to increase precision of the amplitude modulation, a wider loop bandwidth is favorable in EDGE mode. Therefore, to set the open loop frequency bandwidth of the amplitude loop to a bandwidth of 1.8 MHz, the embodiment uses an amplitude loop filter implemented in two section. The first section includes capacitors C2 and C3 and a resistor R3 connected in series to the capacitor C3 and provides a low frequency pole, a zero and a high frequency pole. The second section is comprised of the capacitor C1 and provides a low frequency pole. The combination of the two sections results in the amplitude filter whose frequency characteristic is represented by solid line A.

However, in the amplitude loop including the loop filter LPF2 having two low frequency poles, one zero and a high frequency pole. Stability is only conditional. Stability is achieved at the condition that the phase margin reaches a reasonable value at the frequency where the open loop gain is exactly equal to one.

In GMSK mode, the first section of the amplitude loop filter is replaced by a simple resistor so that the amplitude loop filter provides only one pole at low frequency and the amplitude loop remains stable. The load LPF3 can also be used for calibrating the output power of the transmitter. In GMSK mode, when the output from the power amplifier 210 is to be controlled with a GMSK signal and/or when high-precision amplitude control is not required, the load LPF3 is preferred as it increases the phase margin necessary to provide a very good loop stability. This leads to an efficient circuit configuration without increasing the number of constituent components.

By disposing the load LPF3 and the switch SW2 and by controlling the gain of the amplifiers IVGA and MVGA of the amplitude loop according to the output control voltage VRAMP from the baseband circuit 300 to generate an output control voltage VAPC to the power module, the APC circuit required for the GSM system of the prior art to detect the output level and to control the output from the power amplifier 210 can be removed. Since amplitude modulation is not required when the amplitude loop is used in the GMSK modulation mode, the modulation loop is more stable in the GMSK mode than in the 8-PSK modulation mode. However, due to higher output power with GMSK signals, higher noise levels are also output from the transmitter. Therefore, the loop bandwidth is desirably set to a value of 1.2 MHz, less than 1.8 MHz in EDGE mode and the amplitude loop bandwidth is at 200 kHz, less than 1.8 MHz in the 8-PSK modulation mode. For this purpose, the ample load resistor LPF3 used to provide only one pole in the overall loop is more suitable as the amplitude loop filter than the two sections filter LPF2 comprising two poles at low frequency, one zero and one pole at high frequency. The radio-frequency IC 100 of the embodiment is configured also applicable to a GSM system where the power amplifier is controlled directly by the VRAMP signal. In such a case, the switch SW1 is set to supply the signal from the VRAMP digital to analog converter directly to the power module 200.

In the 8-PSK modulation mode, the output from the power amplifier 210 is detected by the coupler 220 in the amplitude loop. The detected signal is converted by the mixer 132 into a signal of an intermediate-frequency (IF) bandwidth. The signal is amplified by the variable gain amplifier MVGA to a feedback signal SFB to be supplied to the amplitude detector 150. In the detector 150, the feedback signal SFB is compared with a transmitting signal modulated by the quadrature modulator 120 to resultantly detect an amplitude difference. The difference is amplified by the variable gain amplifier IVGA to be applied as a control voltage VAPC to the output control terminal of the power amplifier 210 so as to achieve amplitude control. In the embodiment, the power amplifier 210 includes, for example, a field-effect transistor (FET) with a drain terminal, a source terminal, and a gate terminal. The drain or source terminal is being applied with a voltage corresponding to the control voltage VAPC by a voltage control circuit (230 in FIG. 4) disposed in the power module 200. The gate terminal is applied with an appropriate bias voltage VBIAS generated by a bias circuit, not shown.

Although not shown in FIG. 1, an attenuator ATT is disposed between the coupler 220 and the mixer 132 to attenuate the output from the coupler 220 to supply the attenuated signal to the mixer 132. Low-pass filters MLPF1 and MLPF2 are respectively arranged between the mixer 132 and the amplifier MVGA and between the MVGA and the amplitude detector 150 (reference is made to FIGS. 5 and 6).

In the embodiment, to set the sum of gain of variable gain amplifiers MVGA and IVGA to an almost fixed value, the respective gain values are controlled in mutually opposing directions by the gain control circuit 160 according to the control voltage VRAMP from the baseband circuit 300. In association therewith, the output voltage from the level shifter LVS or the control voltage VRAMP from the baseband circuit 300 can be selectively fed via the switch SW1 to the output control terminal of the power amplifier 210 in the configuration. That is, in the embodiment, while the power amplifier 210 is controlled by the control voltage from the amplitude loop in the 8-PSK modulation mode. In the GMSK mode, the control voltage VRAMP from the baseband circuit 300 can be supplied, in place of the control voltage from the amplitude loop, directly to the power amplifier 210 to control the output therefrom. The switch SW1 operates under control of the sequencer 180 according to the setting state of the register 170 set by the baseband circuit 300.

In the polar loop transmission circuit, a frequency response characteristic of the system is determined according to the filter of the amplitude loop and gain of each component of the loop. To satisfy requirements for modulation precision or error vector magnitude (EVM) of a transmission waveform and the spectral re-growth, the magnitude loop desirably has a higher frequency bandwidth. On the other hand, to suppress noise in the receiving frequency bandwidth 20 MHz apart from the transmitting frequency, it is desired to reduce the frequency bandwidth of the magnitude loop. The inventors of the present invention have found that to satisfy the requirements of the EVM, the spectral re-growth, and the suppression of noise in the configuration of the embodiment, the open loop frequency bandwidth of the amplitude loop is desirably set to a position about 1.8 MHz apart from the transmitting frequency. To make the amplitude loop have an open loop frequency characteristic indicated by a solid line A in FIG. 2, the embodiment employs as the loop filter LPF2 a two section filter which includes capacitors C2 and C3 and a resistor R3 connected in series to the capacitor C3 and which has two poles and one zero.

However, since the frequency bandwidth of the loop actually varies due to variation or dispersion of characteristics of constituent components of the amplitude loop in production, the requirements cannot be satisfied without prior calibration. Since root-mean-square (RMS) power of the power amplifier is determined by the gain of the feedback path of the amplitude loop and the reference level, the output power from the power amplifier 210 cannot be appropriately set when the gain variations in the feedback path have not been calibrated out. More specifically, when the filter LPF2 including the capacitors C1, C2 and C3 and the resistor R3 is used, there exists a probability that the phase margin is not sufficient to guarantee stability and that the loop oscillates. To overcome the difficulty in the embodiment, the variation in gain of the feedback path is measured as described below such that according to results of the measurement, the gain values of the amplifiers MVGA and IVGA are calibrated to set the gain of the overall amplitude loop, namely, the frequency bandwidth of the amplitude loop to a value within a specified range in the vicinity of 1.8 MHz.

To keep the frequency bandwidth of the amplitude loop at a fixed value, it is necessary to keep the open loop gain at a fixed value. However, in the operation to control the power amplifier output power by the amplitude loop, when the gain of the variable gain amplifier circuit MVGA on the feedback path changes, the gain of the amplitude loop also varies. This reduces the phase margin and hence the loop becomes less stable. In the operation to control the power amplifier output power in the embodiment, when the gain of the amplifier MVGA on the feedback path increases (decreases), the gain of the amplifier IVGA on the forward path is changed in the opposing direction, namely, is decreased (increased). As a result, the open loop gain can be kept at a fixed value and hence the frequency bandwidth of the amplitude loop is also kept unchanged.

However, it is difficult to measure the entire system at once to determine the variation in the frequency characteristic due to variation in characteristics of constituent components of the amplitude loop in production. According to the present invention, the amplitude loop is divided into three sections respectively including the power amplifier, the feedback path, and the forward path, each of which needs to be calibrated.

The feedback path is a path ranging from the coupler 220 connected to an output port of the power amplifier to an input port of the amplitude detector 150. The forward path is a path ranging from the input port of the amplitude detector 150 to an input port of the power amplifier.

Figure 3:
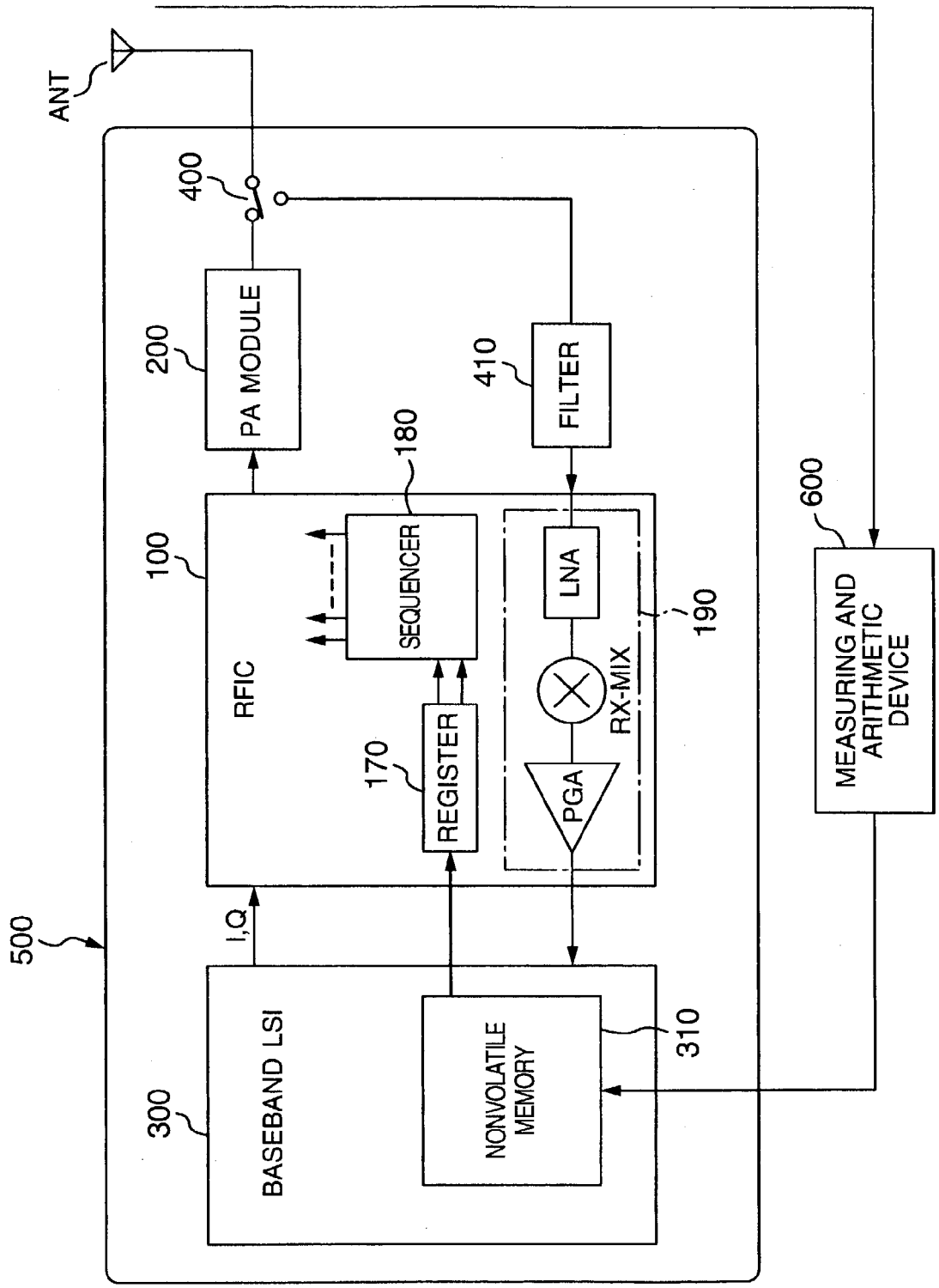
FIG. 3 is a block diagram showing an example of a configuration of a wireless communication apparatus using a high-frequency integrated circuit (IC) using a polar loop method and a measuring system according to an embodiment of the present invention.

As shown in FIG. 3, the radio-frequency IC 100, the power module 200, the baseband circuit 300, and a transmission/reception switch 400, and a filter 410 to remove unnecessary waves from the reception signal and the like are mounted on a substrate to configure a portable telephone terminal system 500. In this state, the measurement is carried out by a measuring and arithmetic device 600.

Measurement 1

Figure 4:
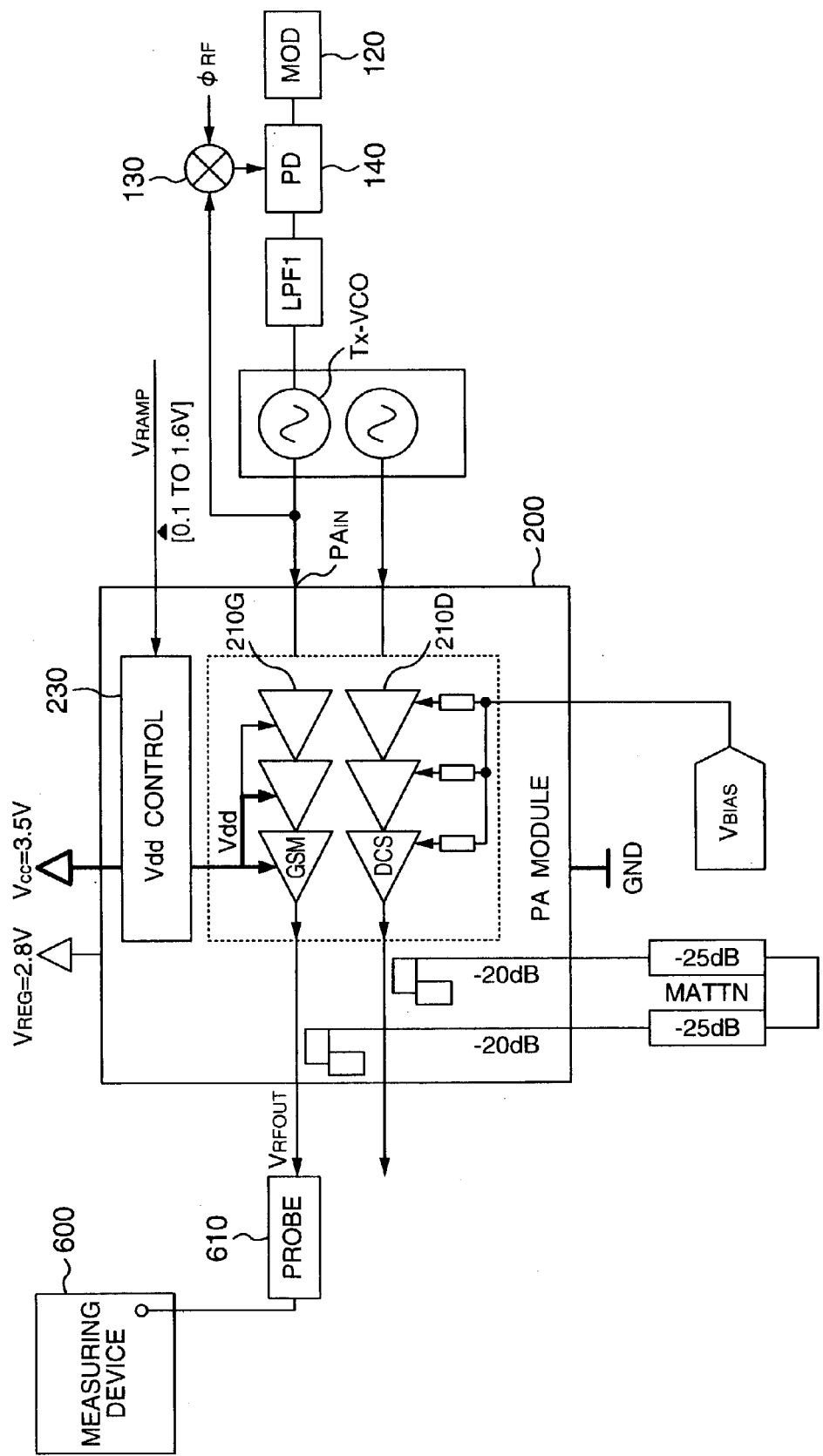
FIG. 4 is a block diagram showing an outline of a configuration of a circuit, which operates when an output power characteristic of an output power amplifier is measured.

FIG. 4 shows circuits used in a first measurement. First, a probe 610 extended from the measuring and arithmetic device 600 is brought into contact with an output terminal of the power module 200 to measure an output voltage VRFOUT from the power amplifier 210 when the VRAMP signal applied to the VAPC input is varied. Data thus measured is used to correct the variation in amplitude modulation gain of the power amplifier 210. The output control voltage VAPC may be supplied from the baseband circuit 300 or the measuring and arithmetic device 600.

Although not explained in conjunction with FIG. 1, the embodiment is configured to conduct, in addition to the GSM transmission, transmission according to a digital cellular system (DCS) 1800. Therefore, in the system of the embodiment, the power module 200 includes power amplifiers 210G and 210D which respectively amplify and output the transmission signals of the respective systems. Each of the amplifiers 210G and 210D includes a three-stage amplifier configured using a field-effect transistor (FET) or the like. The bias voltage VBIAS is a voltage to supply a bias point to a gate terminal of an amplifier FET of each stage. The power module 200 includes a Vdd controller 230 which generates and supplies a power source voltage Vdd according to the output control voltage VAPC, the voltage Vdd being fed to a drain of the amplifier FET of each stage.

In the first measurement, for example, the switch SW1 is set such that the feedback voltage from the amplitude loop is not fed to the power module 200, and the phase loop is set to an effective state. In this state, an oscillation signal φTX from the transmitting oscillator TxVCO is fed to an input terminal of the power amplifier 210G or 210D and the bias voltage VBIAS is applied as above. By directly controlling the power module 200 by the output control voltage VPAC (VRAMP), an output voltage VRFOUT from each of the power amplifiers 210G and 210D is measured. The measured values are calculated to obtain an output characteristic of each of the power amplifiers 210G and 210D with respect to the control voltage VAPC.

Specifically, according to the measured data, a function (an expression) indicating a relationship between the output voltage $VREF_{out}$ from the power amplifier and the output control voltage VAPC is obtained. By differentiating the function, a first differential function $\alpha_1$ and a second differential function $\alpha_2$ are obtained. The first differentiation $\alpha_1$ indicates whether or not the gain $dVRF_{OUT}/dVAPC$ of the power amplifier linearly changes with respect to the output control voltage VAPC. According to the measured results, a control table to change the output power POUT from the power amplifier with respect to the output control voltage VAPC can be produced. By storing the control table in the nonvolatile memory 310 of the baseband circuit 300 and by outputting the output control voltage VRAMP during the transmission of data, it is possible to control the power amplifier in the direct mode.

According to the second differential function $\alpha_2$, a slope parameter, which will be described later, is obtained for each power amplifier GSM and DCS. The second differentiation, $\alpha_2$ indicates whether the rate of change of the gain is positive or negative, as if the gain of the power amplifier increases or decreases with VAPC. The slope parameters are stored in the nonvolatile memory 310 of the baseband circuit 300. Data to adjust the gain values of the amplifiers MVGA and IVGA can be obtained according to the slope parameters. By supplying the data to the radio-frequency IC such that the IC outputs a control voltage VAPC to correct the characteristic of the power amplifier. This leads to a desired linear operation of the power amplifier 210.

Measurement 2

Figure 5:
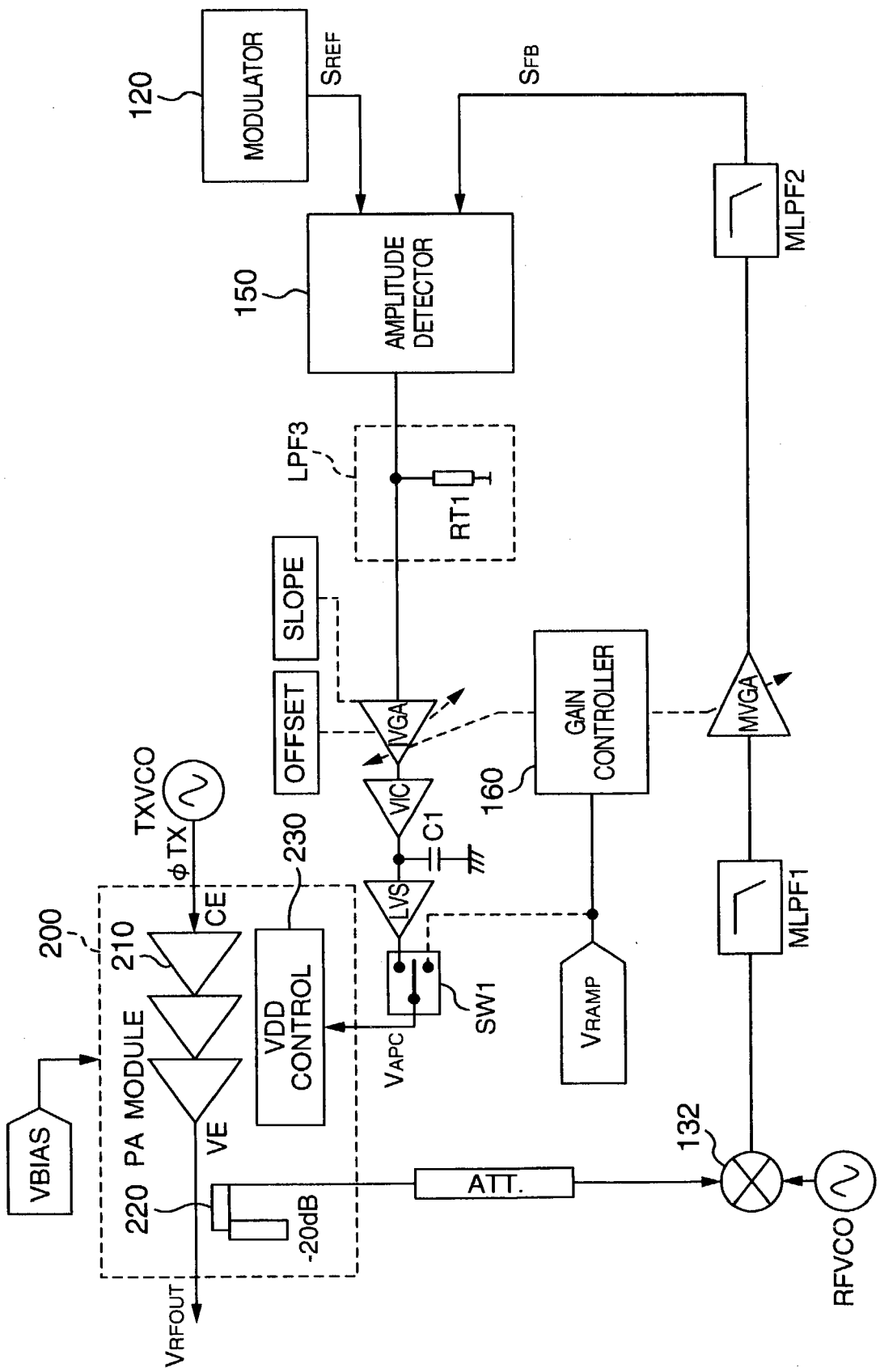
FIG. 5 is a block diagram showing an outline of a configuration of a circuit which operates when an open gain characteristic of an amplitude control loop is measured using a load, i.e., a load low-pass filter (LPF) 3 to reduce the number of poles to one in overall loops in the polar-loop transmitting circuit according to an embodiment of the present invention.

FIG. 5 shows an outline of the second measurement. The measurement is conducted to gather data to calibrate gain variation in the feedback path of the amplitude loop.

Figure 2:
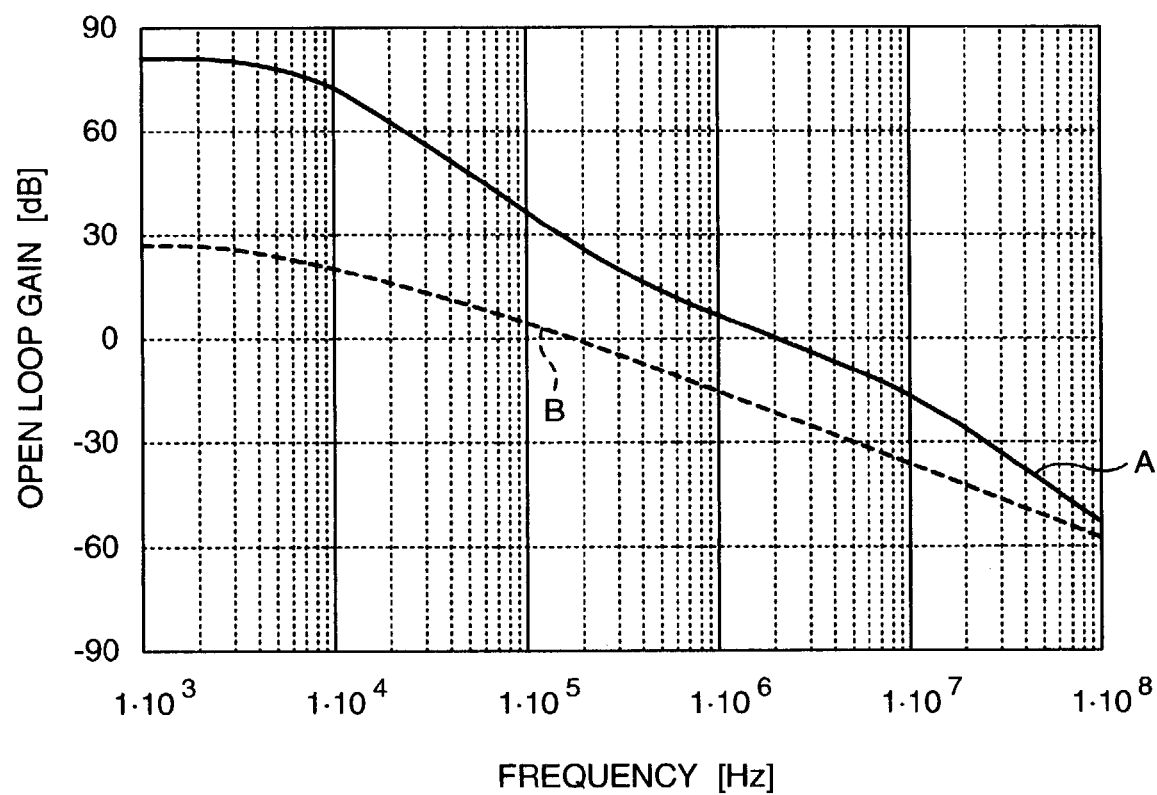
FIG. 2 is a graph showing an open loop gain characteristic of an amplitude control loop in the transmitting circuit of FIG. 1.

In consideration of stability of the amplitude loop, the gain measurement is conducted using the load LPF3 including a resistor RT1 having a frequency characteristic indicated by a broken line B in FIG. 2. The resistor RT1 has a resistance value to set the open loop frequency bandwidth of the amplitude loop including the load LPF3 to about 200 kiloherz (kHz). The amplitude loop including the load LPF3 has only one pole and hence the phase margin does not decrease below 90°. This guarantees stability of the loop. The system of the second measurement operation with a type I amplitude loop in which integration appears once in the open loop transfer function or one pole exists at a low-frequency. However, provided the stability is guaranteed by low gain variation in the loop, it is possible to use type II in which integration appears twice in the open loop transfer function or two poles exist at low-frequency.

In the second measurement, the oscillation signal φTX is applied from the transmitting oscillator TxVCO to the input terminal of the power amplifier 210 and the bias voltage VBIAS is also applied as shown in FIG. 5, and the output control voltage VRAMP is applied to the gain controller 160 to control the gain values of the variable gain amplifiers MVGA and IVGA. While applying a reference signal SREF not modulated to the amplitude detector 150, the amplitude loop is operated in a closed loop to measure the output voltage VRFOUT from the power amplifier 210 in this state. The output control voltage VRAMP to be fed to the gain controller 160 may be supplied from the baseband circuit 300 or the measuring and arithmetic device 600.

A power amplifier output characteristic Pout [dBm] with respect to the output control voltage VRAMP to set a gain of the variable gain amplifier MVGA on the feedback path is then measured. The measured data is calculated to obtain an output control voltage VRAMP necessary to obtain a desired amplifier output to produce a control table. The control table is stored in the nonvolatile memory 310 in the baseband circuit 300. When the load LPF 3 is used to operate the loop for transmission, the data in the control table is set from the baseband circuit 300 to the register 170 in the radio-frequency IC 100 for actual control. The data obtained in the second measurement is also used to determine the output control voltage VRAMP supplied from the baseband circuit 300 to the radio-frequency IC 100.

Measurement 3

FIG. 3 shows an outline of the third measurement. The measurement is conducted to gather data to calibrate gain variation in the overall amplitude loop.

In the third measurement, the switch SW2 selects, as the loop filter, the filter LPF2 including the capacitors C1, C2 and C3 and the resistor R3 to set the magnitude loop to a loop having a frequency characteristic indicated by a solid line A in FIG. 2. The gain measurement is conducted in this state. Therefore, the amplitude loop including the loop filter LPF2 has an open loop frequency bandwidth of about 1.8 MHz. The third measurement is conducted after the amplitude loop stability is increased by conducting the second measurement (to prevent oscillation).

Figure 6:
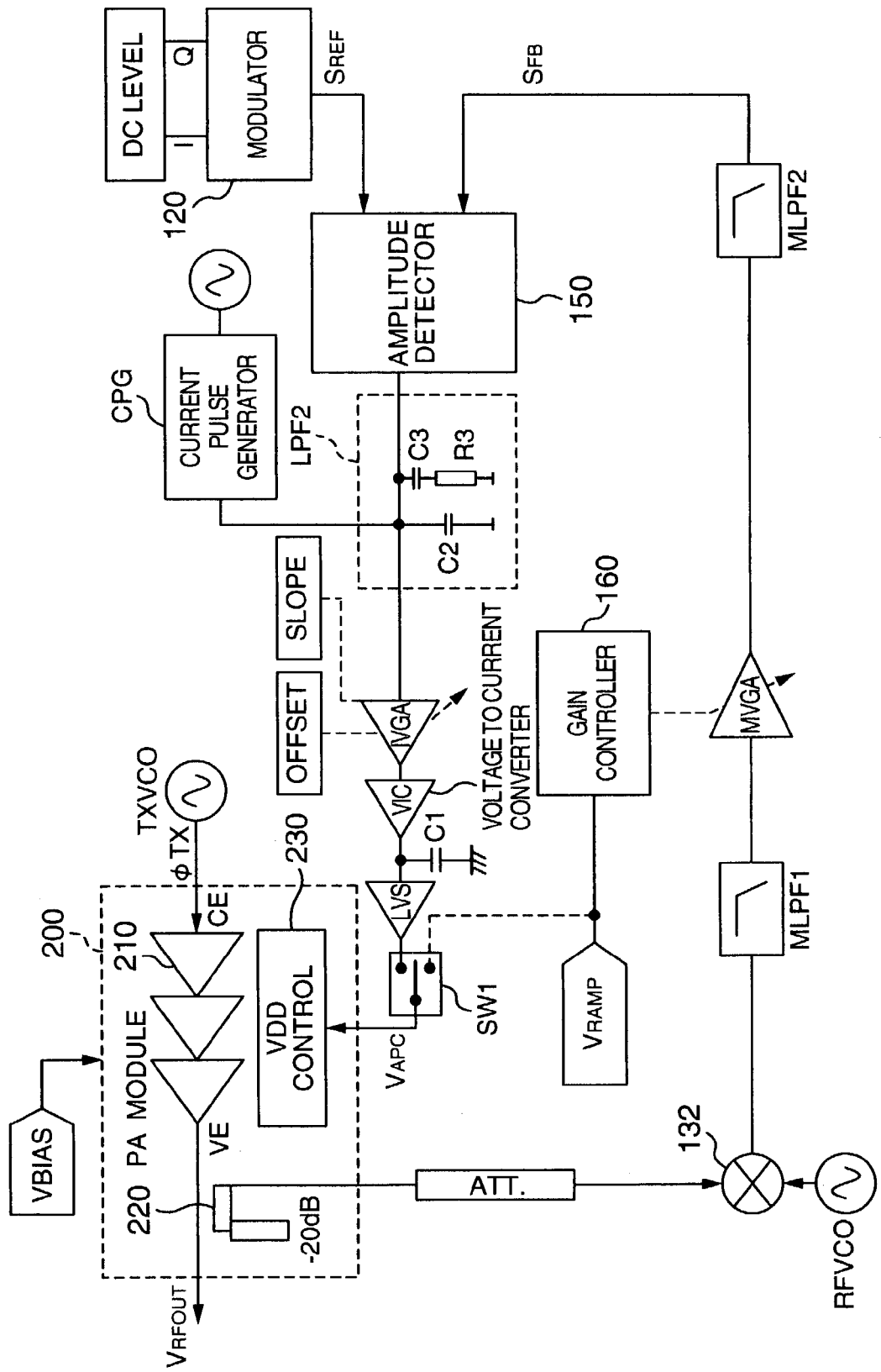
FIG. 6 is a block diagram showing an outline of a configuration of a circuit which operates when an open gain characteristic of an amplitude control loop is measured using a filter, i.e., an LPF 2 of a high degree in the polar-loop transmitting circuit according to an embodiment of the present invention.

In the third measurement, the oscillation signal φTX is applied from the transmitting oscillator TxVCO to the input terminal of the power amplifier 210 and the bias voltage VBIAS is also applied as shown in FIG. 6, and the output control voltage VRAMP is applied to the gain controller 160 to control the gain values of the variable gain amplifiers MVGA and IVGA. While applying an amplitude-modulated reference signal to the amplitude detector 150, the amplitude loop is operated in a closed loop (type II) to measure the output voltage VRFOUT from the power amplifier 210 in this state. The output control voltage VRAMP to be fed to the gain controller 160 may be supplied from the baseband circuit 300 or the measuring and arithmetic device 600.

In the third measurement, a current pulse from the current pulse generator CPG is applied to the input terminal of the amplifier IVGA to measure the side band frequency levels at the output of the power amplifier 210 in this state. As a result, the loop gain is also calculated for a frequency (receiving frequency) which is apart, for example, about 2 MHz from the frequency of the carrier signal (TxVCO). The current pulse generator CPG can be configured using an amplifier and a charge pump. The circuit is beforehand incorporated in the chip. However, the system may be configured so that a specified current pulse can be externally supplied to the input terminal of the amplifier IVGA. When the current pulse generator CPG is incorporated in the chip, the system may be configured such that a clock signal generated from a high-precision oscillator circuit such as a crystal oscillator is externally supplied to the system. The current pulse generator CPG then divides the clock signal to generate a current pulse having a specified frequency.

Figure 7:
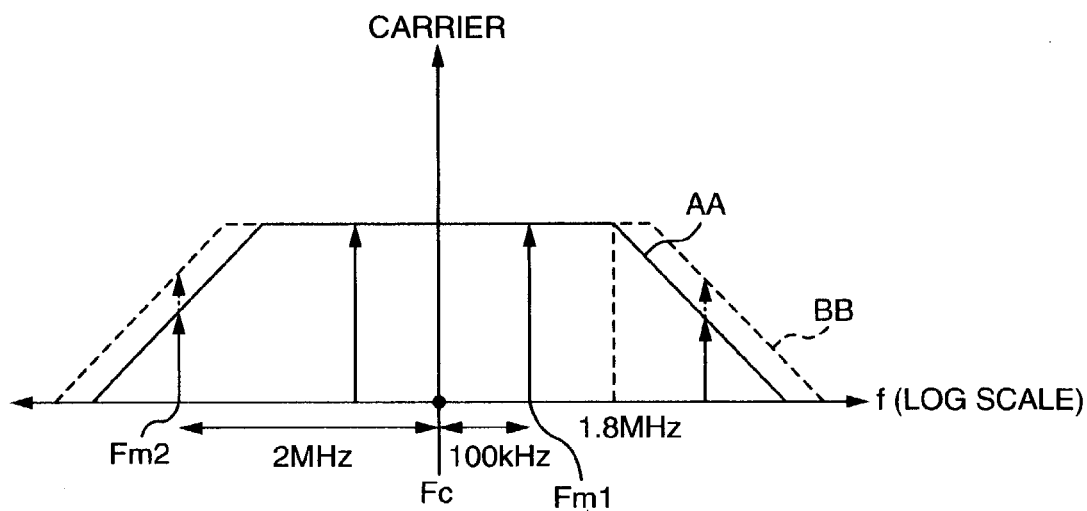
FIG. 7 is a graph showing a frequency response characteristic in amplitude modulation when the amplitude control loop is in a closed loop state.

FIG. 7 shows a frequency response characteristic when the amplitude modulation is conducted in the closed-loop state. In the amplitude modulation, the amplitude of a modulated signal is kept unchanged (the modulation index or radio deviation is fixed), and the operation is conducted with at least two amplitude modulating frequencies to vary only the side-band frequency of the amplitude-modulated signal. Specifically, a frequency contained in a passing band of the frequency characteristic of the amplitude loop, for example, a frequency about 100 kHz from the transmitting frequency Fc) is selected as a first modulating frequency Fm1. A frequency contained in an attenuation band of the frequency characteristic of the amplitude loop, for example, a frequency about 2 MHz from the transmitting frequency Fc) is selected as a second modulating frequency Fm2.

According to the measured power amplifier output (or the antenna output), a frequency spectrum of the amplitude-modulated signal is analyzed to obtain a power level to frequency characteristic of the side-band component. In FIG. 7, a solid line AA is an example of an ideal characteristic and a broken line BB is an example of a measured characteristic. The abscissa indicates the frequency in logarithm in FIG. 7. In this case, the broken line BB indicates that the measured frequency characteristic is higher than the ideal frequency characteristic. In the neighborhood of a frequency (a unity gain frequency) at which the gain is "1" in the open loop characteristic (type II), the closed loop gain shows a small peaking. Therefore, a modulating frequency above this frequency is chosen so that an attenuation can be measured.

The frequency characteristic resulting from the third measurement is calculated and compared to the desired characteristic. From this comparison can be calculated a relative difference in the amplitude loop gain. This difference is used to act the open loop gain so that the open loop frequency bandwidth satisfies the condition of about 1.8 MHz. There is obtained a gain offset value to be supplied to the variable gain amplifier IVGA on the forward path so that the frequency bandwidth satisfies the condition of about 1.8 MHz. The gain offset value is stored as a control data in the nonvolatile memory 310 of the baseband circuit 300. When the loop is operated using the filter LPF2 to conduct transmission in the 8-PSK modulation mode, the data in the control table is set from the baseband circuit 300 to the register 170 in the radio-frequency IC 100 for actual control.

The gain variations of the power amplifier 210 and the amplitude loop are obtained by conducting calculations using data items obtained through the first, second, and third measurement. Calibration or correction values (offset values and slope of the open loop gain values) necessary to calibrate the variations are then calculated to be stored in the nonvolatile memory 310 of the baseband circuit 300. At startup of transmission of the modulated signal, the values are sent to and are set to the register 170 of the radio-frequency IC 100. The offset values set to the register 170 is supplied to the variable gain amplifier IVGA on the forward path to cancel the variations of the differential characteristic $dVR_{OUT}/dVAPC$ of the power amplifier, the variations of the sum of the gain of the feedback path and the variations of the gain of the forward path, to set the open loop frequency bandwidth to about 1.8 MHz. The slope values are supplied to the variable gain amplifier IVGA on the forward path to compensate for the second differential function α2 of the input/output characteristic of the power amplifier. As a result, the variation in the characteristic of the power amplifier and the variation in the frequency bandwidth of the amplitude loop due to the variation in characteristics of constituent components in production can be reduced.

Next, description will be given of gain control for the variable gain amplifier IVGA on the forward path and the variable gain amplifier MVGA on the feedback path.

To keep the amplitude loop frequency bandwidth in a fixed band, it is necessary to keep the open loop gain at a fixed value as described above. However, in an operation to control the power amplifier output power by the amplitude loop, when the gain of the amplifier MVGA on the feedback path changes, the gain of the amplitude loop varies and the frequency bandwidth changes resulting in low phase margin. This lowers stability of the loop. To cope with the difficulty in the embodiment, in the operation to control the output power of the power amplifier, when the gain of the amplifier MVGA on the feedback path increases, the gain of the amplifier IVGA on the forward path is decreased. Conversely, when the gain of the amplifier MVGA on the feedback path decreases, the gain of the amplifier IVGA on the forward path is increased. This keeps the open loop gain at a fixed value, and hence the frequency bandwidth of the amplitude loop is kept in a fixed band.

In a portable telephone terminal for the EDGE or GSM system, the power is controlled such that the output power P of the power amplifier is increased or decreased to a predetermined value within a fixed period of time. In the polar loop, the power control operation is conducted by controlling the gain of the amplifier MVGA. Specifically, since the feedback signal of the amplitude loop decreases when the gain of the amplifier MVGA is decreased, in reaction, the power amplifier is controlled to increase the gain GPA (POUT/PIN) for the matching the feedback signal with the reference signal from the modulation circuit. Therefore, the output power POUT is increased. When it is desired to reduce the output power POUT, the gain of the amplifier MVGA is simply increased. In the embodiment, the gain of the amplifier MVGA is controlled by the control voltage VRAMP from the baseband circuit 300.

Figure 8A:
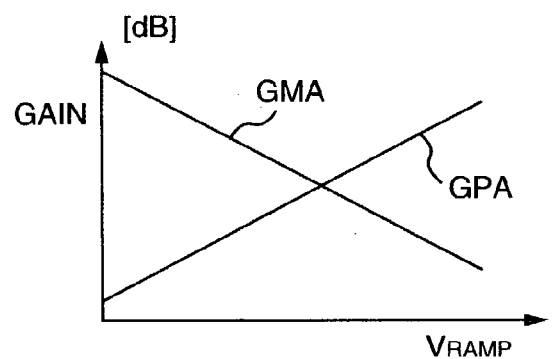
FIG. 8A is a graph showing a relationship between an output control voltage VRAMP and gain of a variable gain amplifier circuit in a polar-loop transmitting circuit according to an embodiment of the present invention.
Figure 8B:
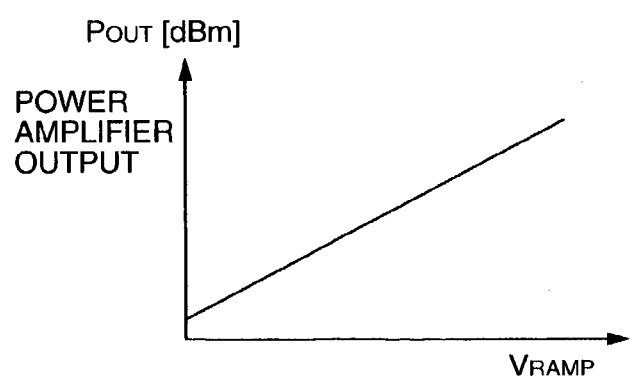
FIG. 8B is a graph showing a relationship between an output control voltage VRAMP and an output power of an output power amplifier in a polar-loop transmitting circuit according to an embodiment of the present invention.

In the embodiment, the rate of decrease or increase in the gain GMVGA of the variable gain amplifier MVGA and that of increase or decrease in the gain GPA of the power amplifier 210 are fixed in any situation. Therefore, the gain variation of the amplifier MVGA with respect to the control voltage VRAMP is indicated by a straight line, i.e., a solid line GMA drawn from an upper left point to a lower right point in FIG. 8A. The RF gain variation of the power amplifier 210 with respect to the control voltage VRAMP is indicated by a straight line, i.e., a solid line GPA drawn from a lower left point to an upper right point in FIG. 8A. The output power POUT of the power amplifier 210 expressed in dBm, linearly increases with respect to the control voltage VRAMP expressed in V as shown in FIG. 8B. The operation to linearly control the output power POUT of the power amplifier 210 by the control voltage VRAMP in dB unit is effective to operate the amplitude loop in a stable state.

On the other hand, the reference signal SREF from the modulation circuit is a signal modulated in the 8-PSK modulation and the amplitude component of the signal is changed. However, the amplitude component of the output power POUT from the power amplifier 210 is controlled to match that of the reference signal SREF by the action of the amplitude control loop. The output power POUT of the power amplifier 210 is kept at a specified value by the power control operation described above. That is, according to the polar loop, when keeping VRAMP constant, the gain of the MVGA is fixed and the output power of the power amplifier is exactly following the variations of the reference signal with the feedback gain as a fixed ratio.

Figure 9:
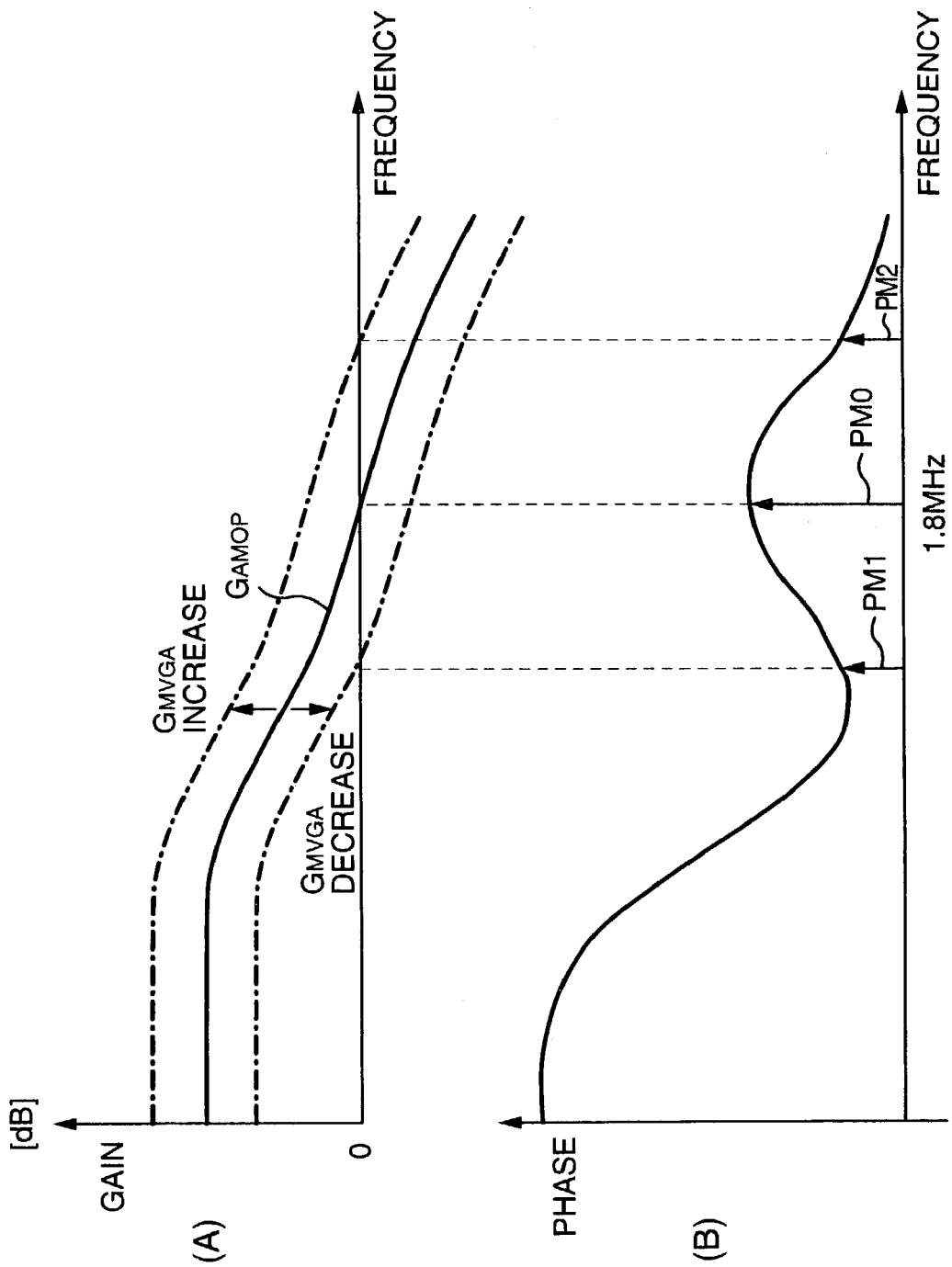
FIG. 9 is a graph showing a gain characteristic of an open loop of an amplitude loop and a phase characteristic of the amplitude loop when a loop filter LPF 2 is used.
Figure 10:
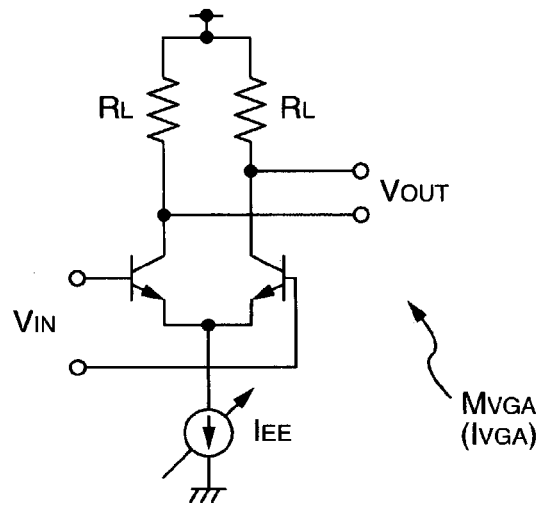
FIG. 10 is a circuit diagram showing a specific example of a variable gain amplifier circuit employed in an embodiment of the present invention.

However, to operate the amplitude loop in a stable state, variations in the open loop gain of the amplitude loop must be possibly reduced to the minimum. FIG. 9 shows a frequency characteristic of the open loop of the amplitude loop using the loop filter LPF2. While (A) of FIG. 9 shows a gain characteristic of the amplitude loop, (B) of FIG. 9 shows a phase characteristic of the amplitude loop. PM0 to PM2 indicate phase margins. Decrease in the phase margin deteriorates stability of the amplitude loop. This is a problem to be solved. The open loop gain GAMOP of the amplitude loop increases or decreases in proportion to the variation in the gain GMVGA of the amplifier MVGA. Since the phase of the loop does not change in this case, the phase margin is reduced to PM1 or PM2 relative to the phase margin PM0 appearing when the gain of the amplifier MVGA is set at the optimum value.

Figure 11:
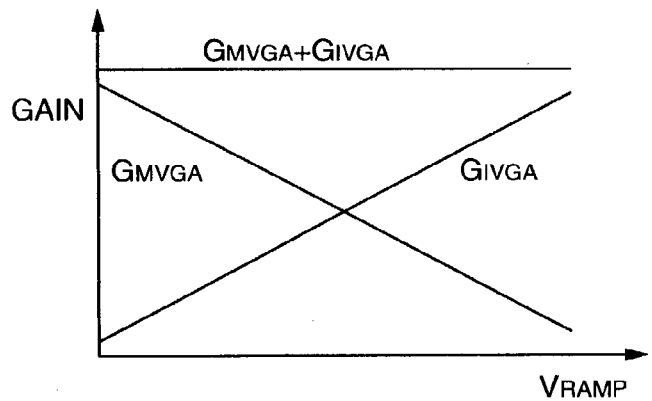
FIG. 11 is a graph showing relationships between an output control voltage VRAMP and gain of a variable gain amplifier circuit (MVGA) on a feedback path and gain of a variable gain amplifier circuit (IVGA) on a forward path in a polar-loop transmitting circuit according to an embodiment of the present invention.

In the embodiment, the problem is solved by controlling the amplifiers MGVA and IVGA so that the sum (GIVGA+GMVGA) of the gain of the amplifier IVGA on the forward path and that of the amplifier MVGA on the feedback path is fixed. In other words, the relationships between the control voltage VRAMP and the gain GIVGA and the gain GMVGA are drawn respectively as a straight line extending upward to the right and a straight line extending downward to the right as shown in FIG. 11.

In the embodiment, as shown in FIG. 1, the gain controller 160 generates bias currents IMVGA and IIVGA according to the control voltage VRAMP, and the gain GMVGA and the gain GIVGA respectively of the amplifiers MVGA and IVGA are controlled respectively by the bias currents IMVGA and IIVGA from the gain controller 160. Assume that each of the amplifiers MVGA and IVGA includes a general differential amplifier including a bipolar transistor. The gain GAMP of the differential amplifier is expressed as $$GAMP = 20 \log_{10}(VOUT/VIN) = 20 \log_{10}(RL \cdot IEE/2VT) \quad (1)$$

In equation (1), IEE is a bias current of the differential amplifier, RL is a load resistor, and VT is a thermoelectric voltage (KT/q).

The gain of the amplifier is proportional to the bias current IEE as indicated by equation (1). Therefore, to linearly change the gain GMVGA and the gain GIVGA in dB respectively of the amplifiers MVGA and IVGA with respect to VRAMP, the bias currents IMVGA and IIVGA must be varied along an exponential function of the control voltage VRAMP. The bias current IIVGA of the amplifier IVGA is expressed as IIVGA=IEE·exp ($\log_e 10$·VRAMP).

Figure 12:
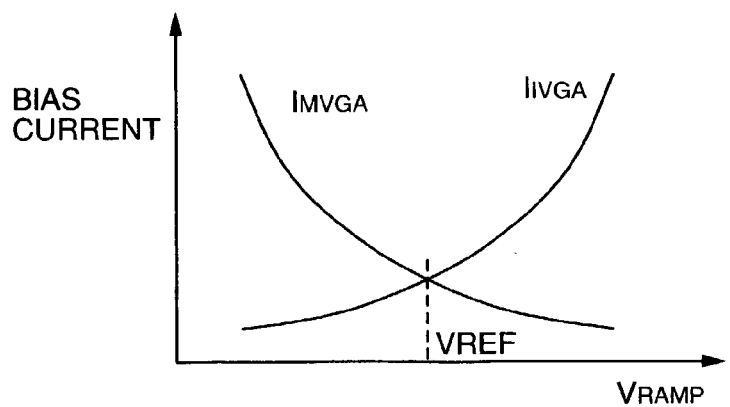
FIG. 12 is a graph showing relationships between an output control voltage VRAMP and a bias current of a variable gain amplifier circuit (MVGA) on a feedback path and a bias current of a variable gain amplifier circuit (IVGA) on a forward path in a polar-loop transmitting circuit according to an embodiment of the present invention.
Figure 13:
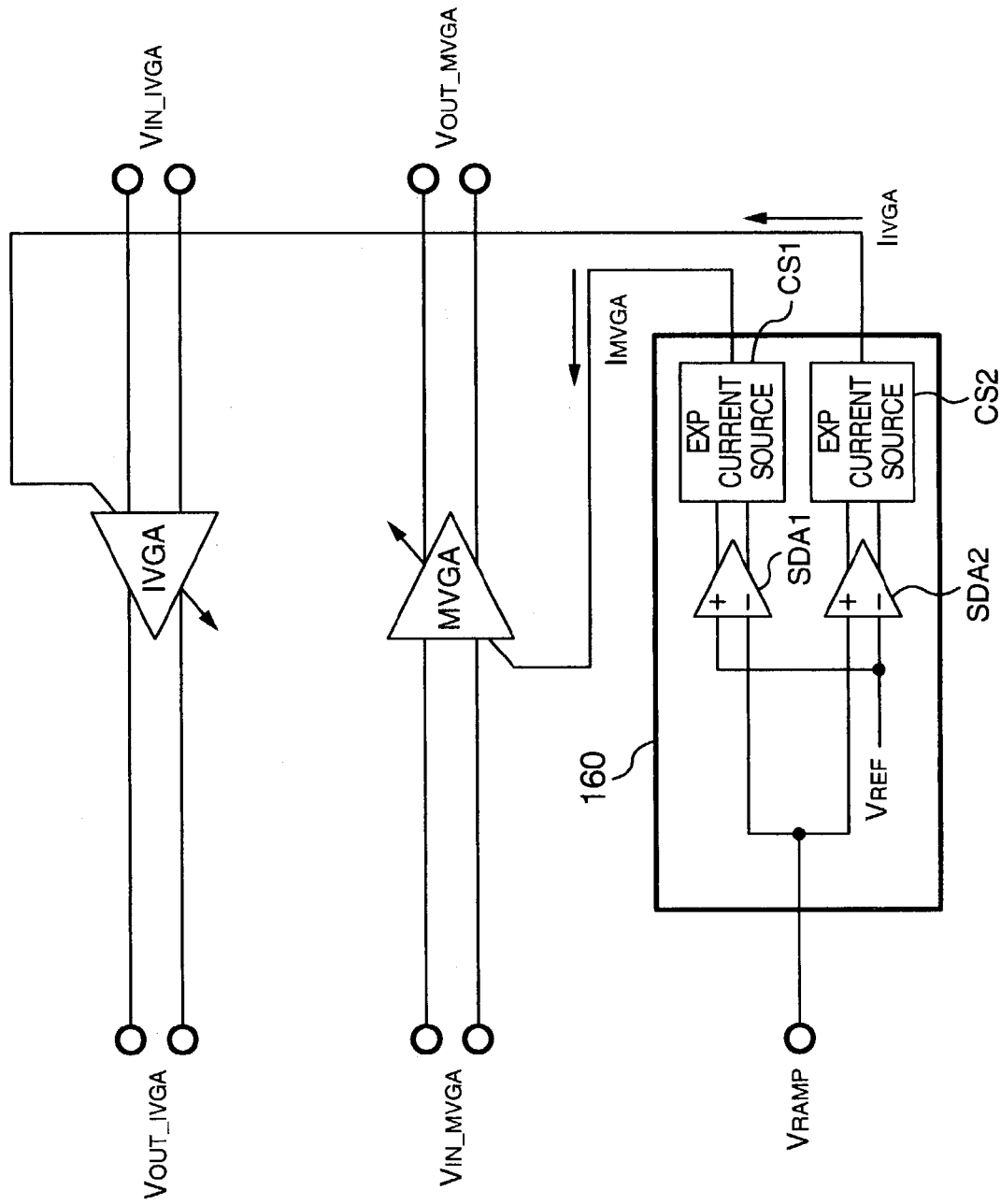
FIG. 13 is a circuit configuration diagram showing an example of a configuration of a gain control circuit employed in an embodiment of the present invention.

The gain controller 160 of FIG. 1 includes, as shown in FIG. 13, current source circuits CS1 and CS2 to respectively generate exponentially changing bias currents IMVGA and IIVGA and single differential amplifiers SDA1 and SDA2 respectively drive the current source circuits CS1 and CS2. The control voltage VRAMP is fed to an inverse input terminal of the amplifier SDA1 and the reference voltage VREF is applied to a non-inverse input terminal thereof. Conversely, the control voltage VRAMP is fed to a non-inverse input terminal of the amplifier SDA2 and the reference voltage VREF is applied to an inverse input terminal thereof. The target is that, the bias current IIVGA of the amplifier IVGA and the bias current IMVGA of the amplifier MVGA change with respect to the control voltage VRAMP along a curved line of an exponential function shown in FIG. 12.

When the bias currents IMVGA and IIVGA are fed respectively to the amplifiers MVGA and IVGA, the gain GIVGA of TVGA and the gain GMVGA of MVGA linearly change as shown in FIG. 11. Therefore, the sum of the gain GIVGA+GMVGA if kept fixed. Consequently, even when the gain of the amplifier MVGA is changed to control the output power POUT of the power amplifier 210, the open loop characteristic of the amplitude loop is not changed and hence the phase margin is not reduced.

Figure 14:
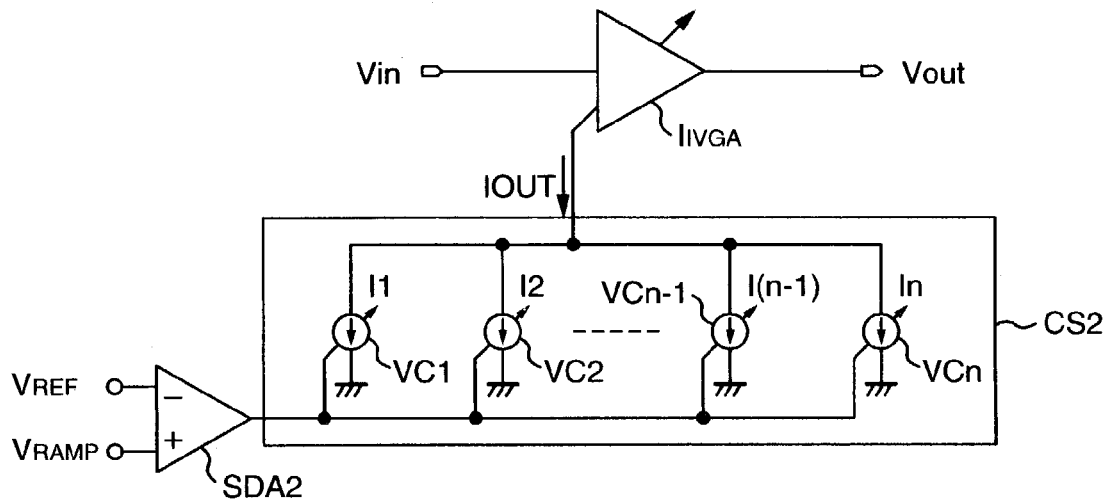
FIG. 14 is a configuration diagram showing an outline of a configuration of a bias current generator circuit constituting the gain control circuit of FIG. 13.

Description will now be given of a concrete circuit example of the gain control circuit 160 to generate the exponentially changing bias currents IMVGA and IIVGA. FIG. 14 shows an outline of the current source circuit CS2 to generate the bias current IIVGA to be fed to the amplifier IVGA. The current source circuit CS2 of the embodiment includes a plurality of variable current sources VC1, VC2, ..., VCn having mutually different current values and start levels. The variable current sources VC1, VC2, ..., VCn are controlled by the input control voltage VRAMP and mixes the currents therefrom with each other to produce a bias current. The obtained current exponentially varies with respect to the control voltage VRAMP.

Figure 15:
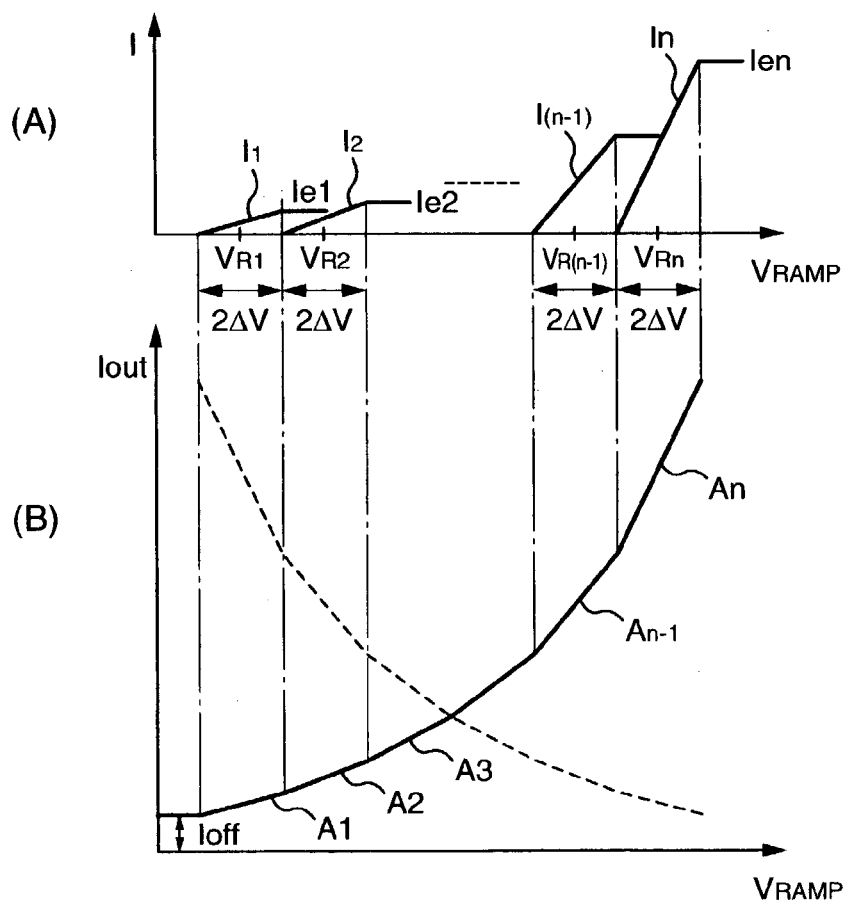
FIG. 15 is a graph showing a relationship between an output control voltage and a current of each current source and relationship between an output control voltage and a bias current obtained by combining the currents with each other.

Specifically, the variable current sources VC1, VC2, ..., VCn are configured to respectively have voltage-current characteristics shown in (A) of FIG. 15. As can be seen from (A) of FIG. 15, the currents linearly changed in a range of ±ΔV centered respectively on a reference voltage VR1, VR2, ..., VRn. A current saturation level of each current source is substantially equal to a current start level of its subsequent current source. A gradient or slope of the straight line, namely, a current change ratio sequentially becomes greater in an order of the current sources I1, I2, ..., In. In the current source circuit CS1 of the embodiment, the currents I1, I2, ..., In from the current sources VC1, VC2, ..., VCn are mixed with each other to produce the sum of the current values of the currents, and a current equal in the current value to the obtained current is fed as the bias current IIVGA to the amplifier IVGA. The current approximates an exponential variation with respect to the control voltage VRAMP. Consequently, the gain of the amplifier IVGA expressed in dB linearly changes with respect to the control voltage VRAMP.

In (B) of FIG. 15, a solid line shows how the bias current IIVGA changes with respect to the control voltage VRAMP. As can be seen from the graph of (B), the bias current IIVGA changes like a broken-line graph. A first line segment A1 is a current I1 of the current source VC1, a subsequent line segment A2 is the sum of the currents I1 and I2 of the current sources VC1 and VC2, a further subsequent line segment A3 is the sum of the currents I1, I2, and I3 of the current sources VC1, VC2, and VC3, and a last line segment An is the sum of the currents I1, I2, ..., In of the current sources VC1 to VCn. In the current source circuit CS2 of the embodiment, the current values I1, I2, ..., In respectively of the current sources VC1 to VCn are set such that the broken line of (B) of FIG. 15 approximates to an exponential curve. The current source circuit CS2 to generate the bias current IMVGA of the variable gain amplifier MVGA is configured such that the mixed currents obtained by mixing currents from a plurality of variable current sources with each other form a line which exponentially decreases as indicated by the broken line in (B) of FIG. 15.

Figure 16:
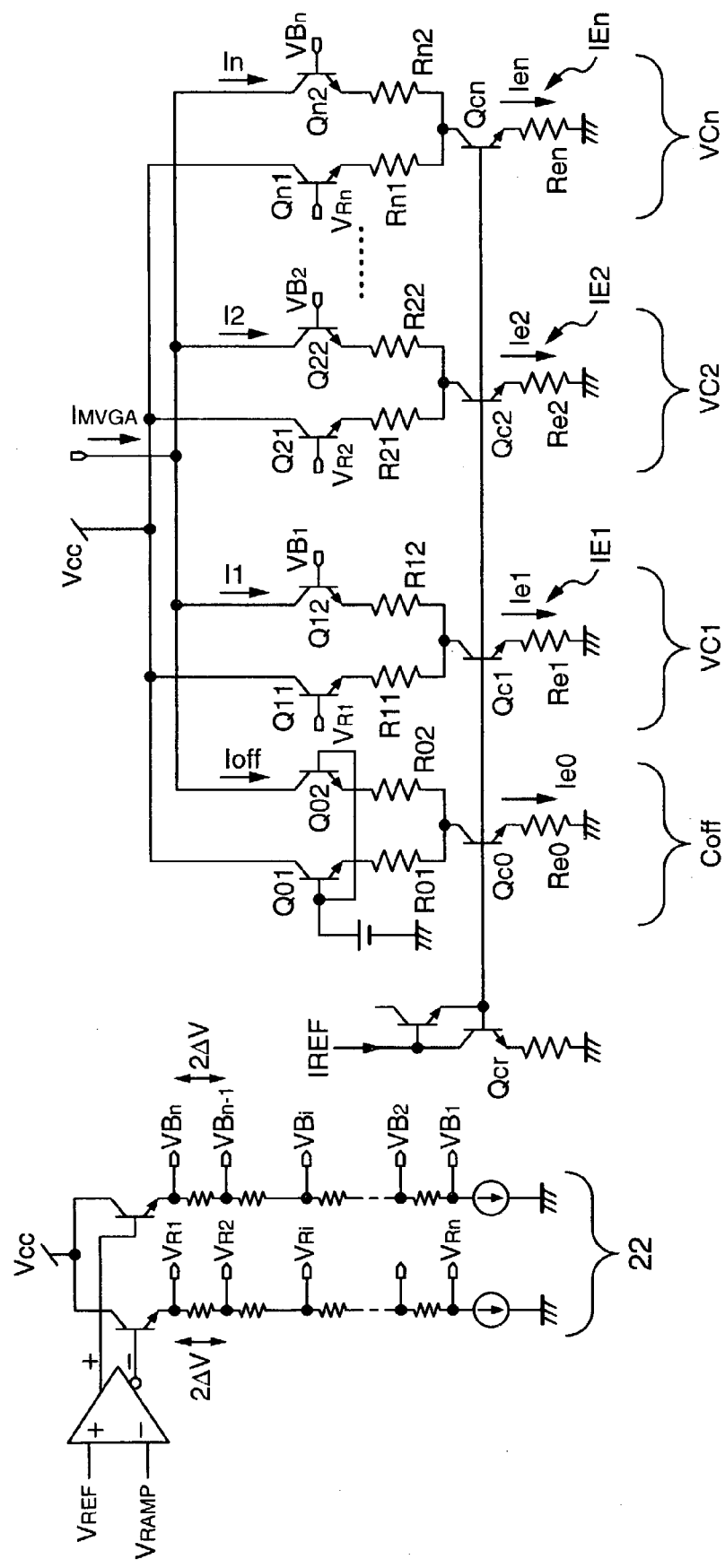
FIG. 16 is a circuit diagram showing a specific example of the bias current generator circuit of FIG. 14.

FIG. 16 shows a concrete example of a circuit configuration of the bias current. The variable current sources VC1, VC2, ..., VCn respectively include bipolar transistors Q11, Q21, ..., and Qn1 of which base terminals are applied with associated reference voltages VR1, VR2, ..., and VRn; and transistors Q12, Q22, ..., Qn2 respectively associated with the transistors Q11, Q21, ..., and Qn1. The configuration further include resistors, R11 and R12, R21 and R22, ..., Rn1 and Rn2; and constant current sources IE1, IE2, ..., IEn respectively associated with the transistors Q12, Q22, ..., Qn2. Each associated pair of the transistors, for example, the pair of Q11 and Q12 is connected as follows. Emitters of Q11 and Q12 are connected respectively via the resistors R11 and R12 to the current source IE1. The other pairs of the transistors are also connected via the associated resistors to the associated current sources as shown in FIG. 16. In the pair of the transistors including a first transistor and a second transistor, a collector terminal of the first transistor is connected to a power source voltage Vcc and the second transistor is commonly connected to the other second transistors of the other transistor pairs. As a result, collector currents I1, I2, ..., In respectively of Q12, Q22, ..., Qn2 are mixed with each other to produce a bias current Iout.

To generate base voltages VR1, VR2, ..., VRn respectively of the transistors Q11, Q21, ..., and Qn1 and base voltages VB1, VB2, ..., VBn respectively of the transistors Q12, Q22, ..., Qn2 according to the control voltage VRAMP to control the output level of the linear amplifier 10, a resistance type potential divider circuit 22 is arranged. To supply an offset current Ioff, there is disposed, in addition to the current sources VC1, VC2, ..., VCn, a current source Coff including transistors Q01 and Q02, resistors R01 and R02, a constant current transistor Qc0, and an emitter resistor Re0. The current source Coff is arranged to supply a minimum bias current to a linear amplifier 10 even when the control voltage VRAMP is zero volt.

The constant current sources IE1, IE2, ..., and IEn of the variable current sources VC1, VC2, ..., VCn include bipolar transistors Qcq, Qc2, ..., Qcn and emitter resistors Re1, Re2, ..., Ren, respectively. Bases of the transistors Qcq, Qc2, . . . , Qcn are applied with a voltage substantially equal to a base voltage of a transistor connected to the transistors in a current mirror configuration. Since the constant current source IEi of each variable current source VCi (i=1, 2, . . . , n) includes a bipolar transistor Qci and an emitter resistor Rei, the current variation due to the variation in the base-emitter voltage VBE of the transistor becomes smaller when compared with the current source which only uses transistors and which does not use the emitter resistors.

Since the reference current IREF flows through the transistor Qcr in the configuration, currents Ie1, Ie2, . . . , Ien, and Ioff are supplied respectively to the transistors Qc1, Qc2, . . . , Qcn and Qco in proportion to the reference current IREF. The current ratios are determined according to size ratios respectively between the size of the transistor Qcr (particularly, the emitter) and the transistors Qc1, Qc2, . . . , Qcn and Qco and ratios between resistance values of the resistors Re1, Re2, . . . , Ren, respectively. The currents Ie1, Ie2, . . . , Ien respectively flowing through the transistors Qc1, Qc2, . . . , and Qcn are saturation currents respectively of the variable current sources VC1, VC2, . . . , VCn of the current source circuit CS2 shown in FIG. 14. The resistance values of the resistors R01 and R02, R11 and R12, . . . , Rn1 and Rn2 determine the current variation ratio (gradients respectively of the line segments A1, A2, . . . , An shown in (B) of FIG. 15). For each of the variable current sources VC1, VC2, . . . , VCn, a current variation range ±ΔV is determined by the base voltage difference between the paired transistors.

That is, to set the base voltage difference between the paired transistors, the resistance type potential divider circuit 22 generates the base voltages VR1, VR2, . . . , VRn for the transistors Q11, Q21, . . . , Qn1 and the base voltages VB1, VB2, . . . , VBn for the transistors Q12, Q22, . . . , Qn2. In the potential divider 22, the resistance ratios are set such that crossing voltages between the voltages VR1, VR2, . . . , VRn and the voltages VB1, VB2, . . . , VBn changing in association with the control voltage VRAMP become central voltages respectively of current waveforms I1, I2, . . . , In.

In the gain controller 160 of the embodiment, the resistance values respectively of the resistors R01 and R02, R11 and R12, . . . , and Rn1 and Rn2 determine the current change ratios of the respective variable current sources VC1, VC2, . . . , VCn. Therefore, the resistance ratios are almost fixed even the resistance values change, which leads to an advantage that the exponential curve of the bias current IIVGA obtained as the resultant current shown in (B) of FIG. 15 can be almost kept unchanged.

Figure 17:
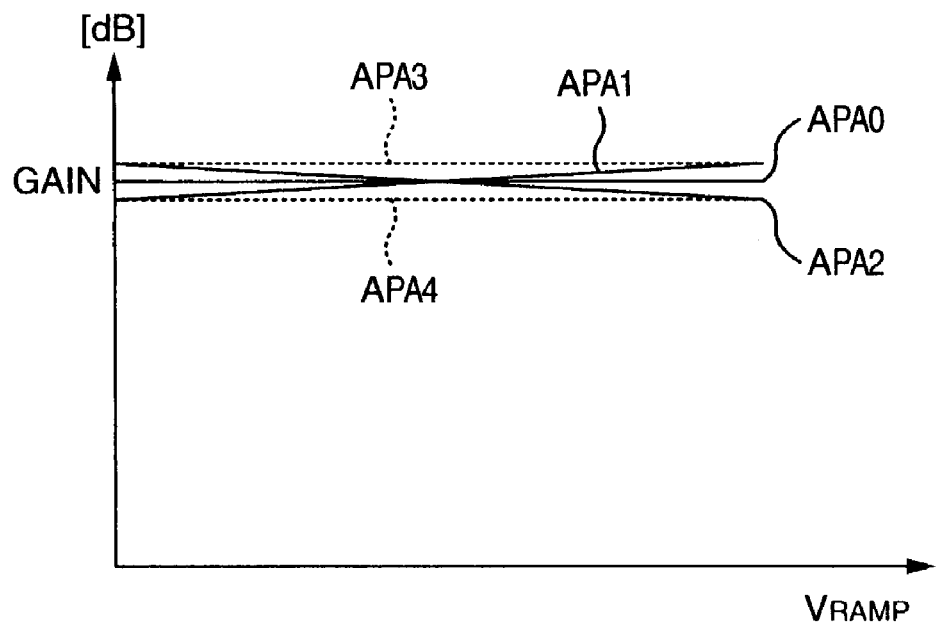
FIG. 17 is a graph showing gain control sensitivity with respect to the output control voltage VRAMP of the output power amplifier.

Next, description will be given of calibration or correction of the variation in the open loop gain of the amplitude loop. The variation is caused, for example, by the gain variations of circuits on the amplitude loop. The variations are due to the variation in characteristics of constituent components in production and must be corrected. For example, assume that the characteristic of the output power POUT of the power amplifier 210 with respect to the output control voltage VRAMP is gain control sensitivity APA. Then, the sensitivity APA of the power amplifier 210 is desirably fixed in the embodiment. FIG. 17 shows a characteristic example of the gain control sensitivity APA expressed in dB of the power amplifier 210 to the output control voltage VRAMP.

Figure 18:
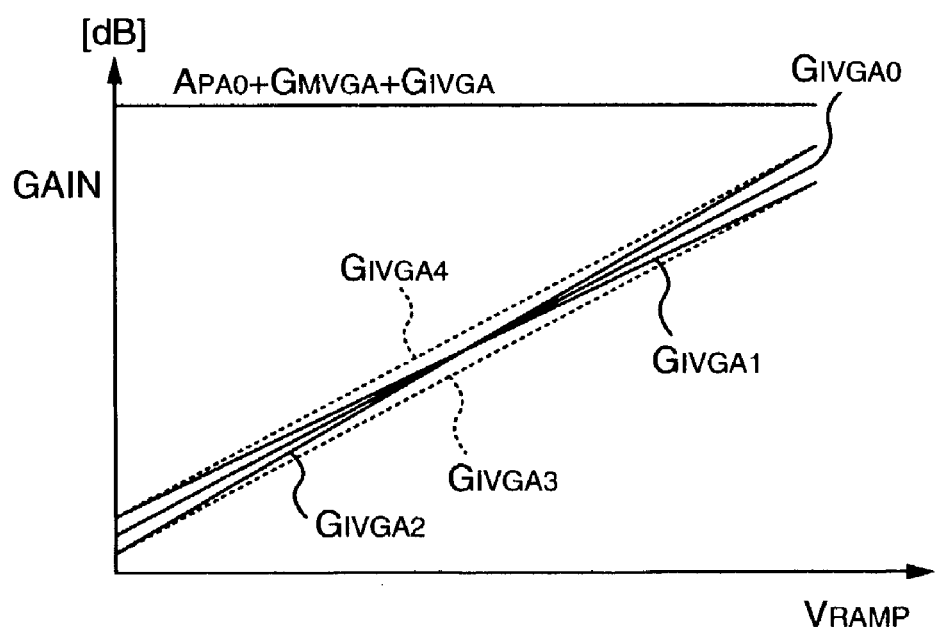
FIG. 18 is a graph showing variation of gain of the variable gain amplifier circuit (IVGA) on the forward path in the polar-loop transmitting circuit according to an embodiment of the present invention.

The gain control sensitivity APA of the power amplifier 210 is favorably fixed regardless of the control voltage VRAMP as indicated by a straight line APA0 in FIG. 17. However, the characteristic line possibly inclines as lines APA1 and APA2 depending on a power amplifier used in the configuration. To overcome the difficulty, there is known a method to correct the variation by changing the gain control sensitivity of the variable gain amplifier IVGA. FIG. 18 shows the characteristic obtained by changing the gain control sensitivity of the variable gain amplifier IVGA. In FIG. 18, a strait line GIVGA0 is a target gain characteristic. When the control sensitivity is reduced relative to that corresponding to the line GIVGA0, there is obtained a straight line GIVGA1 having smaller inclination. Conversely, when the control sensitivity is increased, there is obtained a straight line GIVGA2 having larger inclination.

In a specific correction method, when the gain control sensitivity APA of the power amplifier 210 has, for example, positive inclination like the characteristic line APA1 shown in FIG. 17, the inclination of the gain characteristic of the variable gain amplifier IVGA is reduced like the straight line GIVGA1. As a result, the sum (APA+GMVGA+GIVGA) of the gain APA of the power amplifier 210, the gain GMVGA of the amplifier MVGA, and the gain of the amplifier IVGA is kept fixed with respect to the output control voltage VRAMP. The control characteristic of the gain GMVGA of the amplifier MVGA is fixed by design and is not programmable. Conversely, when the gain APA of the power amplifier 210 has negative inclination like the characteristic line GAP2 shown in FIG. 17, the correction is conducted to increase the inclination of the gain characteristic of the amplifier IVGA as indicated by the straight line GIVGA2. The correction of gain control sensitivity is called "slope correction" in the present specification.

Now let's describe how the offset is calculated when the gain APA of the power amplifier 210 and gains of other circuits simply increase or decrease depending on the production margins. Description will be given of a case in which the gain control sensitivity APA of the power amplifier 210 varies as indicated by broken lines APA3 and APA4 in FIG. 17 with respect to the straight line APA0 as a target characteristic. In FIG. 17, the straight lines APA3 and APA4 show characteristics respectively when the gain control sensitivity APA of the power amplifier 210 increases and decreases. To correct the variations, the control characteristic of the gain GIVGA of the variable gain amplifier IVGA is shifted in an appropriate manner. In FIG. 18, a characteristic indicated as GIVGA3 is obtained when the control characteristic of the gain GIVGA of the amplifier IVGA is shifted to reduce the gain, and a characteristic indicated as GIVGA4 is obtained when the control characteristic of the gain GIVGA of the amplifier IVGA is shifted to increase the gain.

When the gain APA of the power amplifier 210 increases as APA3 in FIG. 17, the control characteristic of the gain GIVGA of the amplifier IVGA is generally shifted to reduce the gain as the straight line GIVGA3 in FIG. 18. Conversely, when the sensitivity APA of the power amplifier 210 decreases as APA4 in FIG. 17, the control characteristic of the gain GIVGA of the amplifier IVGA is generally shifted to increase the gain as the straight line GIVGA4 in FIG. 18. Even when gains of the circuits vary due to production margins, the sum (APA+GMVGA+GIVGA) of the gain APA of the power amplifier 210, the gain GMVGA of the amplifier MVGA, and the gain of the amplifier IVGA can be kept fixed with respect to the output control voltage VRAMP. The gain correction is called "offset correction" in this specification.

Figure 19:
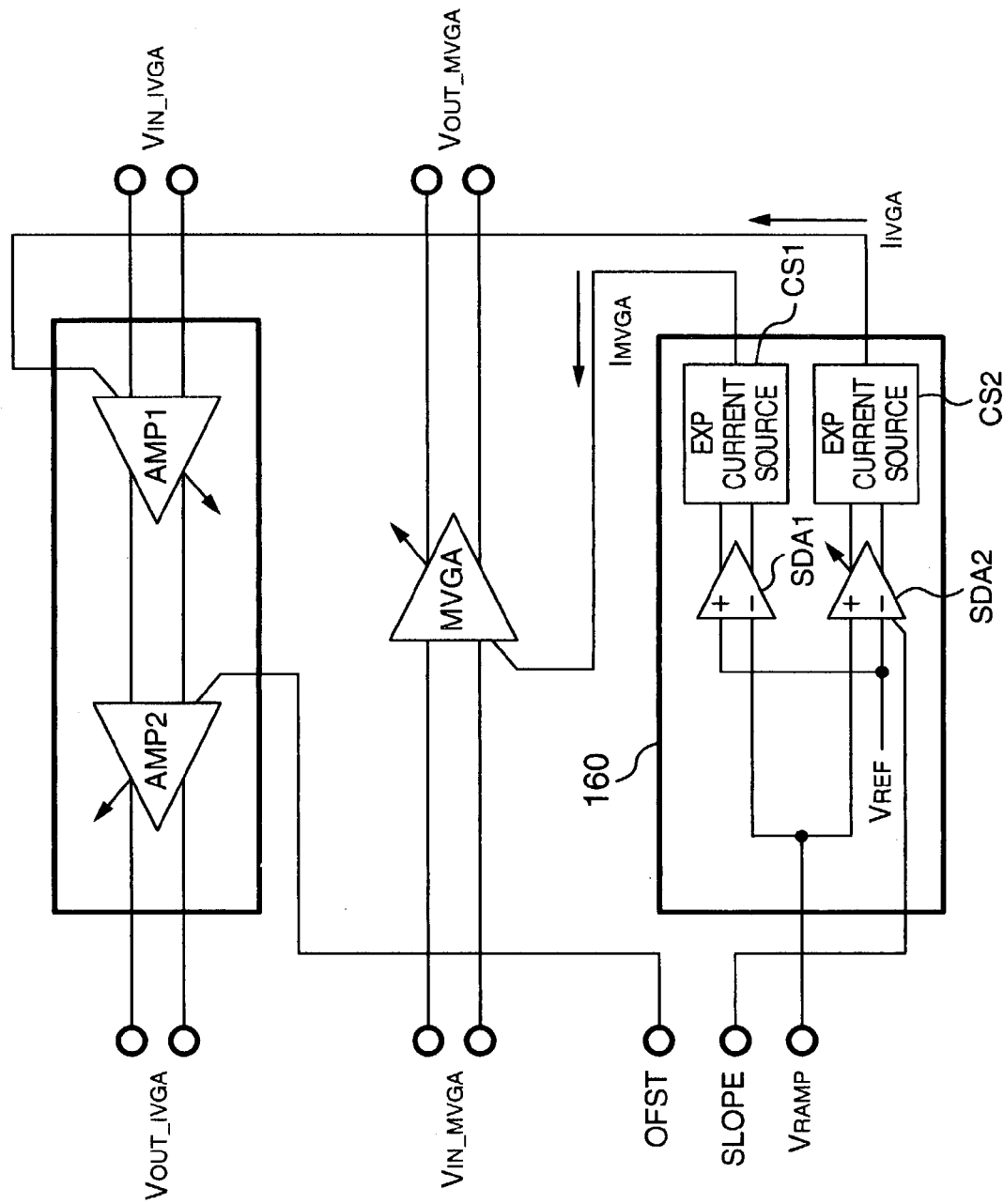
FIG. 19 is a circuit configuration diagram showing another specific configuration example of the gain control circuit.

Description will now be given of an embodiment of a circuit for the correction. FIG. 19 shows a specific example of the gain control circuit 160 to conduct the slope correction and the offset correction. The circuit 160 of the embodiment is configured such that gain of a single differential amplifier SDA2 can be corrected by a slope control signal SLOPE for the slope correction. In the gain controller 160, when the gain of the amplifier SDA2 is set to a higher value by the slope control signal SLoPE, the change ratio of the bias current IIVGA becomes higher. That is, the inclination of the gain GIVGA of the amplifier IVGA can be increased. Conversely, the inclination of the gain GIVGA of the amplifier IVGA can be decreased by setting the gain of the amplifier SDA2 to a lower value.

Figure 21:
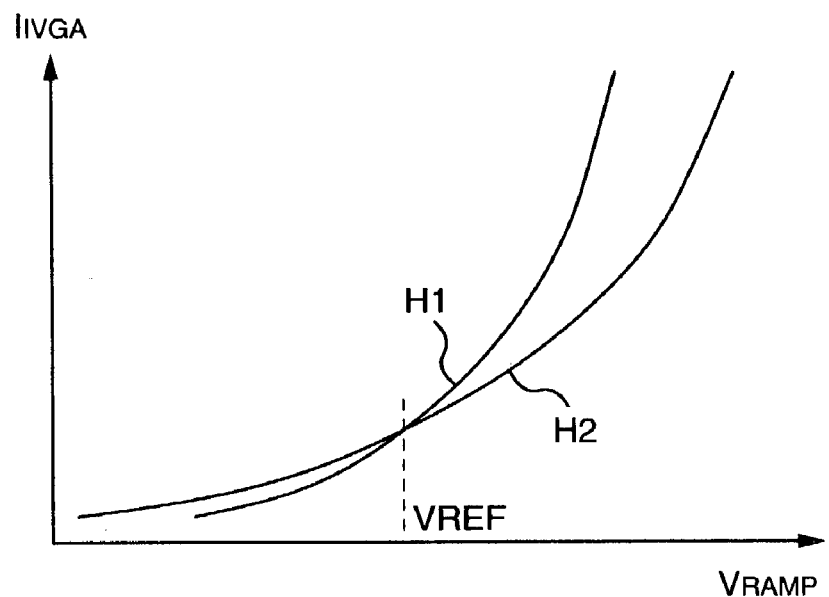
FIG. 21 is a graph showing a characteristic of a bias current IIVGA of the variable gain amplifier circuit IVGA with respect to the output control signal VRAMP when gain of the amplifier is changed by a slope control signal.

FIG. 21 shows a characteristic of the bias current IIVGA of the amplifier IVGA with respect to the output control signal VRAMP when the gain of the amplifier SDA2 is changed by the slope control signal SLOPE. In FIG. 21, a characteristic curve H1 is obtained when the gain of the amplifier SDA2 is increased. The change ratio of IICGA with respect to VRAMP is increased, and the characteristic curve is compressed in a direction of the abscissa centered on the reference voltage VREF. Conversely, a characteristic curve H2 is obtained when the gain of the amplifier SDA2 is reduced. The change ratio of IICGA with respect to VRAMP is reduced, and the characteristic curve is expanded in the direction of the abscissa. Therefore, when the gain of the amplifier SDA2 is increased, the inclination of the gain GIVGA of the amplifier IVGA is increased as GIVGA2 in FIG. 18. When the gain of the amplifier SDA2 is reduced, the inclination of the gain GIVGA of the amplifier IVGA is reduced as GIVGA1 in FIG. 18.

In the embodiment of FIG. 19, the variable gain amplifier IVGA includes a first amplifier AMP1 and a second amplifier AMP2. The first amplifier AMP1 has a function substantially equal to that of the variable gain amplifier IVGA of the embodiment shown in FIG. 13. Gain of the second amplifier AMP2 is changed by an offset control signal OFST. In the embodiment, the gain GIVGA of the amplifier IVGA can be controlled as GIVGA3 and GIVGA4 by changing the gain of the second amplifier AMP2. As a result, the sum (APA+GMVGA+GIVGA) of the gain APA of the power amplifier 210, the gain GMVGA of the amplifier MVGA, and the gain of the amplifier IVGA can be kept fixed. In the configuration of the embodiment shown in FIG. 19, the gain of the first amplifier AMP1 is controlled by the current IIVGA from the gain controller 160 and the gain of the second amplifier AMP2 is controlled by the offset control signal OFST. However, the current IIVGA and the offset signal OFST may be exchanged in the configuration to obtain a similar advantage.

Figure 20:
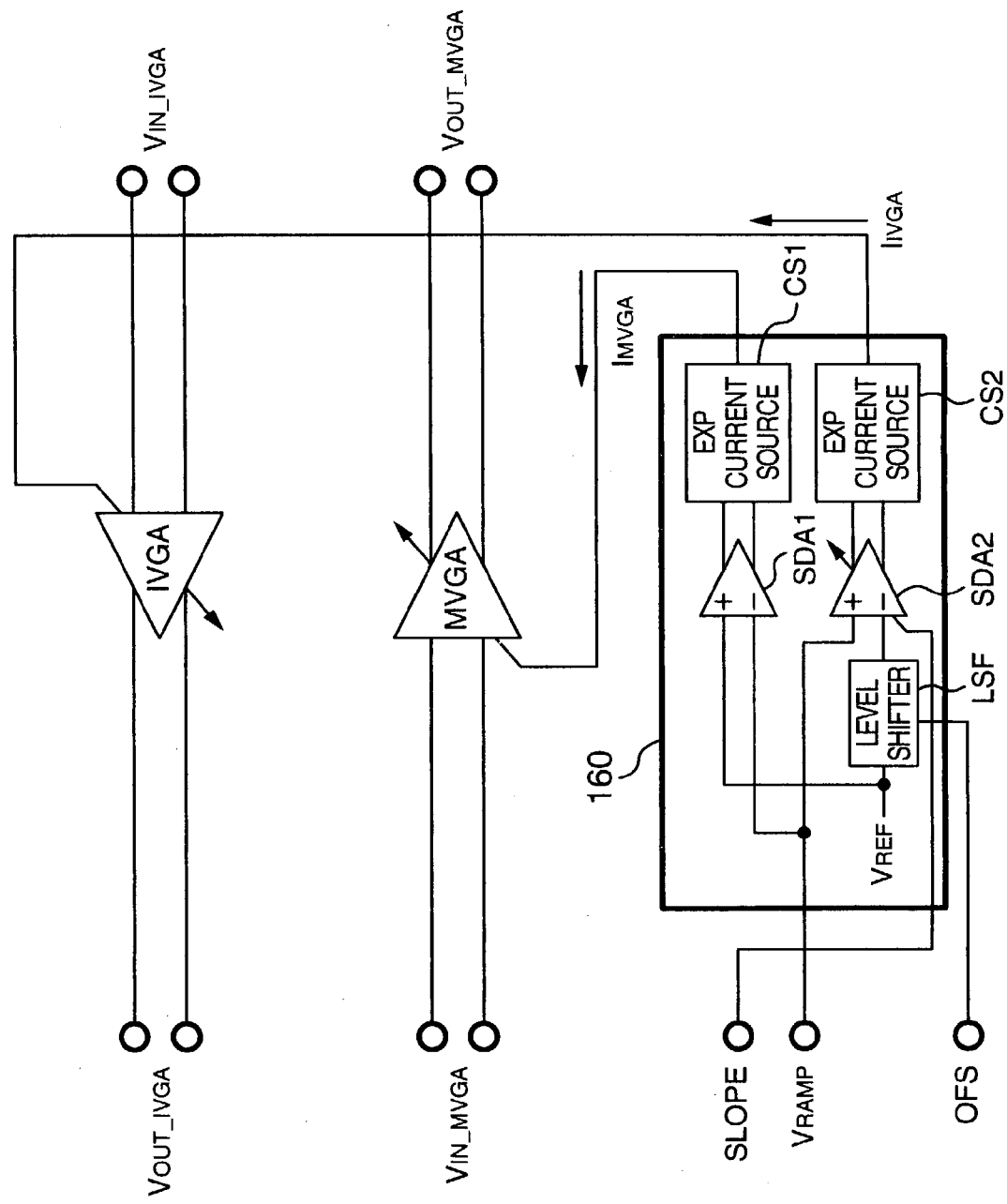
FIG. 20 is a circuit configuration diagram showing further another specific configuration example of the gain control circuit.
Figure 22:
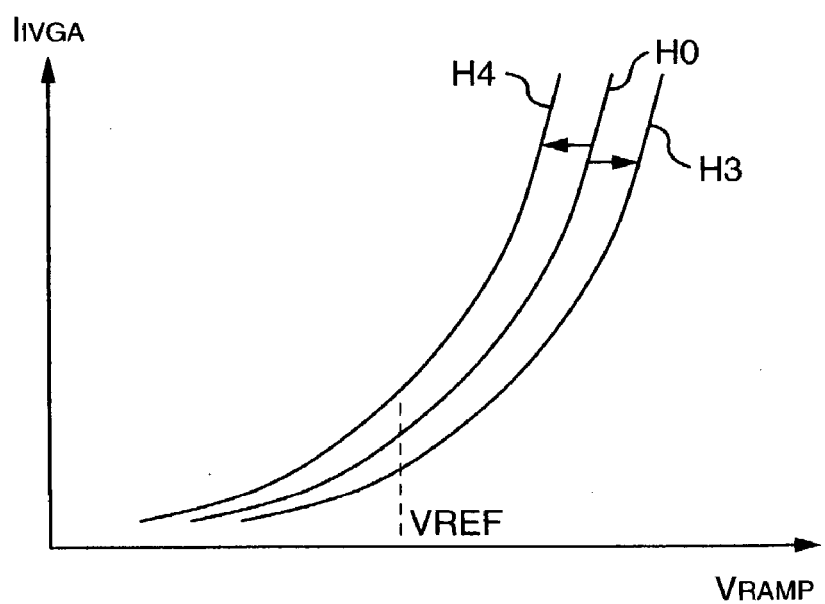
FIG. 22 is a graph showing a characteristic of a bias current IIVGA of the variable gain amplifier circuit IVGA with respect to the output control signal VRAMP when gain of the amplifier is changed by an offset control signal.

In another method of offset correction, a level shift circuit LSF is arranged as shown in FIG. 20 such that a reference voltage VREF supplied to the single differential amplifier SDA2 is shifted by a specified amount of voltage. The level shift circuit LSF is a circuit which adds a fixed voltage VSHIFT to the received voltage to produce a voltage as a result of the addition. The shift voltage VSHIFT is controlled by the offset signal OFST. FIG. 22 shows operation of the embodiment. When the shift voltage VSHIFT is increased by the level shift circuit LSF, the characteristic curve of the bias current IIVGA of the amplifier IVGA is shifted to the right as indicated by H3. Conversely, when the shift voltage VSHIFT is reduced, the characteristic curve of the bias current IIVGA is shifted to the left as indicated by H4.

When the shift voltage VSHIFT is increased, the gain characteristic curve of the amplifier IVGA is generally shifted downward as indicted by GIVGA3 in FIG. 18. Conversely, when the shift voltage VSHIFT is reduced, the gain characteristic curve of the amplifier IVGA is generally shifted upward as indicted by GIVGA4 in FIG. 18. Resultantly, the sum (APA+GMVGA+GIVGA) of the gain APA of the power amplifier 210, the gain GMVGA of the amplifier MVGA, and the gain of the amplifier IVGA can be set to a target value. In the embodiment of FIG. 20, the level shift circuit LSF is arranged on the input side of the reference voltage VREF of the differential amplifier SDA2. However, the level shift circuit LSF may be arranged on the input side of the gain control signal VRAMP of the differential amplifier SDA2. However, the relationship between the shift voltage VSHIFT and the gain GIVGA of the amplifier IVGA is reversed in this case. That is, when the shift voltage VSHIFT is increased, the characteristic curve of the bias current IIVGA of the amplifier IVGA is shifted to the left. Conversely, when the shift voltage VSHIFT is reduced, the characteristic curve of the bias current IIVGA is shifted to the right.

In the polar loop, the phase and the amplitude of the power amplifier can be appropriately controlled by the combination effect of the phase loop and the amplitude loop. Therefore, the polar loop is suitably applicable to a dual mode transmitting circuit coping with the GSM and EDGE systems. This is because only the phase component has information to be transmitted in the GSM system adopting the GSM modulation and the amplitude component also has such information to increase the transfer rate in the EDGE system. In the transmitting circuit using only the GSM system of the prior art, the power amplifier is controlled to obtain a fixed output amplitude. The amplitude loop with a type I amplitude loop can be used to control the amplitude of the GMSK signal and make sure it does not change during transmission. In the polar loop, the feedback signal from the output of the power amplifier is compared with the output from the modulation circuit. Therefore, the power amplifier output (a mean value of output power of the power amplifier) can be controlled without adversely influencing the amplitude-modulated component of the EDGE system. Consequently, the configuration can both for the GMSK system and the EDGE system using the amplitude-modulated component.

However, in both of the GMSK and EDGE system, the power amplifier output must has lower sensitivity with respect to variation in temperature and variations in constituent components. The standards of the GSM system stipulate that power at an antenna end port during the rump-up period, the rump-down period, and data transmitting period must be within a specified time mask in any situation. To conduct such control of the output power in the polar loop, it is required that characteristics of circuits in the loop are reasonably stable. It is also required that the variable gain amplifiers MVGA and IVGA have a wide variable gain range (about 50 dB) and the variations are suppressed over the complete range. Therefore, the control operation is quite difficult. If the variations are beyond the allowable range, there can also be considered to employ a method in which the baseband circuit acquires information of the variations to control the gain values of the amplifiers MVGA and IVGA to resultantly correct the variations. However, in this method, the production cost of the baseband circuit disadvantageously soars. When the gain of the variable gain amplifiers is nonlinear with respect to the control signal, the load imposed on the baseband circuit is also increased and hence the production cost thereof soars. Therefore, it is desired that the gain is linear with respect to the control signal.

Consequently, according to the embodiment, there can be implemented a variable gain amplifier with a wide variable gain range which has low sensitivity to variations in the power supply, temperature, and constituent components and high linearity in gain control. This lowers the load imposed on the baseband circuit and hence the production cost thereof can be reduced.

The present invention has been described in detail using embodiments. However, the invention is not limited to the embodiments, but can be modified in various fashions without departing from the spirit and scope thereof.

For example, in the embodiments, the radio-frequency IC 100 includes the register 170 to set data to correct gain characteristics of the variable gain amplifiers MVGA and IVGA. Data to correct gain characteristics of the variable gain amplifiers MVGA and IVGA is beforehand stored in the nonvolatile memory 310 of the baseband circuit 300. At initiation of operation, the data is fed from the baseband circuit 300 to the radio-frequency IC 100 to be set to the register 170. However, it is also possible that the radio-frequency IC 100 includes a non-volatile memory to beforehand store the data to correct the gain characteristics of the variable gain amplifiers MVGA and IVGA.

In the embodiments, the second measurement is conducted for calibrating the output power of the transmitter and uses the load LPF3 to make the overall loop have only one pole. The third measurement is conducted for amplitude loop gain measurement and adjustment and uses the loop filter LPF2. According to results of the second and third measurement, the calibration is completed.

In the description, the present invention is applied to a dual-band system capable of conducting communications in two systems including the GSM and CDS 1800 systems. However, the present invention is also applicable to a case of a triple-band system configured for communications in the CSM system, the DCS 1800 system, and a personal communication system (PCS) 1900 in which communications can be conducted using phase modulation in the 8-PSK modulation mode in addition to the GMSK modulation mode, and to communications using a 850 MHz band.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of calibrating gain variation for use in a transmitter comprising a phase control loop for controlling a phase of a carrier signal from a transmitting oscillator and an amplitude control loop for controlling amplitude of an output from a power amplifier, a variable gain amplifier on a forward path from an amplitude detection circuit to said power amplifier, and selectable means to switch a loop order of said amplitude control loop, said method comprising the steps of:

assessing gain variation of said amplitude control loop by setting by said selectable means a loop order less than a loop order for normal operation; and calculating said gain variation according to a result of said assessment.

2. A method of calibrating an amplitude modulation loop for use in a transmitter, said amplitude modulation loop having a type I mode and a type II mode and comprising a forward path and a feedback path, each connecting modulation generating means with amplification means operating on a carrier signal, each path containing a loop amplifier and said loop amplifiers being arranged to respond to a common gain control signal in opposite senses, wherein said method comprises:

steps of setting said amplitude modulation loop to the type I mode;

recording the output of said amplification means in response to variation of said common gain control signal; and compensating said recorded response to enable it to be used as calibration information for an operation of said type II mode of said amplitude modulation loop.

3. A method according to claim 2, wherein one of said loop amplifiers has a corrective gain offset and said method further comprises introducing a predetermined test modulation signal into the signal forward path and assessing the corrective effect of the offset by comparing sideband amplitude of outputs of said amplification means at different frequencies of said test modulation signal.

4. A method according to claim 2, wherein said transmitter includes a gain controller which receives a power instruction signal and generates said common gain control signal for said loop amplifiers, said method further comprising:

applying a power instruction signal directly to said amplification means;

assessing said output of said amplification means due to said power instruction signal; and using said assessment to control the operation of said amplification means by adjusting the operation of at least one of said loop amplifiers.

5. A method according to claim 4, wherein said assessment in response said power instruction signal is used to determine a coefficient to be applied to said common gain control signal en route to one of said loop amplifiers, wherein said coefficient is deduced to maintain a bandwidth of said amplitude modulation loop substantially constant in the operation of said modulation generating means.

6. A method of calibrating an amplitude modulation loop for use in a transmitter, said amplitude modulation loop comprising a forward path and a feedback path each coupling with modulation means and amplification means operating on a modulated carrier signal, each path containing a loop amplifier, said loop amplifiers being arranged to respond to a common gain control signal in opposite senses and one of said loop amplifiers having a corrective gain offset, wherein said method comprises:

introducing a predetermined test modulation signal into said forward path; and assessing the corrective effect of said corrective gain offset on loop operation by comparing sideband amplitude of the output of said amplification means at different frequencies of said predetermined test modulation signal.

7. A method according to claim 6, further comprising adjusting said offset and performing said assessment until said comparison achieves a desired result.

8. A method according to claim 6, wherein said test modulation is produced using a square wave of predetermined amplitude and frequency.

* * * * *